(12) United States Patent
Jung

(10) Patent No.: US 12,363,900 B2
(45) Date of Patent: Jul. 15, 2025

(54) THREE-DIMENSIONAL SEMICONDUCTOR DEVICE AND METHOD OF MANUFACTURING THE SAME

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 457 days.

(21) Appl. No.: 17/973,236

(22) Filed: Oct. 25, 2022

(65) Prior Publication Data

US 2023/0301098 A1   Sep. 21, 2023

(30) Foreign Application Priority Data

Mar. 16, 2022 (KR) .......................... 10-2022-0032728

(51) Int. Cl.
*H10B 43/27* (2023.01)
*H10B 43/10* (2023.01)

(52) U.S. Cl.
CPC ............. *H10B 43/27* (2023.02); *H10B 43/10* (2023.02)

(58) Field of Classification Search
CPC .............................. H10B 43/27; H10B 43/20
See application file for complete search history.

(56) References Cited

U.S. PATENT DOCUMENTS

| 9,627,401 B2 | 4/2017 | Tsuda et al. |
| 2015/0194435 A1* | 7/2015 | Lee ......................... H10B 43/35 257/329 |
| 2021/0028186 A1* | 1/2021 | Lim ...................... H10B 43/10 |

FOREIGN PATENT DOCUMENTS

| KR | 1020160137103 A | 11/2016 |
| KR | 102128465 B1 | 7/2020 |

* cited by examiner

*Primary Examiner* — Christopher A Johnson
(74) *Attorney, Agent, or Firm* — WILLIAM PARK & ASSOCIATES LTD.

(57) ABSTRACT

A three-dimensional (3D) semiconductor device includes a plurality of stack structures, a plurality of channel plugs, a slit structure and a plurality of dummy channel plugs. The stack structures include at least two conductive layers and at least two insulation layers, each being alternately stacked. The channel plugs are vertically formed through the stack structure. The slit structure is arranged at one side of the stack structure. The plurality of dummy channel plugs is arranged in the stack structures to be adjacent to the slit structure. Each of the channel plugs includes a channel insulation layer and a channel layer. Each of the dummy channel plugs includes at least one of the channel insulation layer, the channel layer, and a material of the plurality of conductive layers.

8 Claims, 40 Drawing Sheets

THREE-DIMENSIONAL SEMICONDUCTOR DEVICE AND METHOD OF MANUFACTURING THE SAME

CROSS-REFERENCE TO RELATED APPLICATION

The present patent application claims priority under 35 U.S.C. § 119(a) to Korean patent application number 10-2022-0032728, filed on Mar. 16, 2022, in the Korean Intellectual Property Office, which is incorporated herein by reference in its entirety.

BACKGROUND

1. Technical Field

Various disclosures generally relate to a semiconductor device and a method of manufacturing the same, more particularly, to a three-dimensional semiconductor device and a method of manufacturing the three-dimensional semiconductor device.

2. Related Art

An integration degree of a semiconductor device may be mainly determined by an occupying area of a unit memory cell. Recently, as the integration degree of the semiconductor device, which may include a memory cell with a planar type on a substrate, may reach to a limit, a three-dimensional semiconductor device including memory cells stacked on a substrate may be proposed. Further, in order to improve operation reliability of the three-dimensional semiconductor device, various structures and fabrication methods may also be developed.

SUMMARY

According to example embodiments, there may be provided a three-dimensional (3D) semiconductor device. The 3D semiconductor device may include a plurality of stack structures, a plurality of channel plugs, a slit structure and a plurality of dummy channel plugs. The stack structures may include a plurality of conductive layers and a plurality of insulation layers, each being alternately stacked at least twice. The channel plugs may be vertically formed through the stack structure. The slit structure may be arranged at one side of the stack structure. The plurality of dummy channel plugs is arranged in the stack structures to be adjacent to the slit structure. Each of the channel plugs includes a channel insulation layer and a channel layer. Each of the dummy channel plugs includes at least one of the channel insulation layer, the channel layer, and a material of the plurality of conductive layers.

According to example embodiments, there may be provided a method of manufacturing a 3D semiconductor device. In the method of manufacturing the 3D semiconductor device, stack layers are formed by alternately stacking each of a plurality of sacrificial layers and a plurality of insulation layers at least twice. The plurality of sacrificial layers include a nitride material. A plurality of holes are formed through the plurality of sacrificial layers and the plurality of insulation layers. The plurality of holes are arranged along a plurality of columns and rows. The plurality of holes are filled with a channel insulation layer including the nitride material and a channel layer to form channel plugs. A trench is formed by etching the stack layers, to define stack structures, the trench is formed between two adjacent columns, and a portion of each of the channel plugs arranged in the two adjacent columns is removed when the trench is formed, thereby forming dummy channel plugs. The plurality of sacrificial layers are selectively removed in the stack structure to define openings between the plurality of insulation layers of the stack structure. Simultaneously, the nitride material of the channel insulation layer of the dummy channel plug is removed to form gaps in the channel insulation layers. A conductive layer is formed in the openings and the gaps. A slit structure is formed in the trench.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Hereinafter, a 3D semiconductor device of example embodiments may be illustrated in detail with reference to accompanying drawings.

Figure 1A:
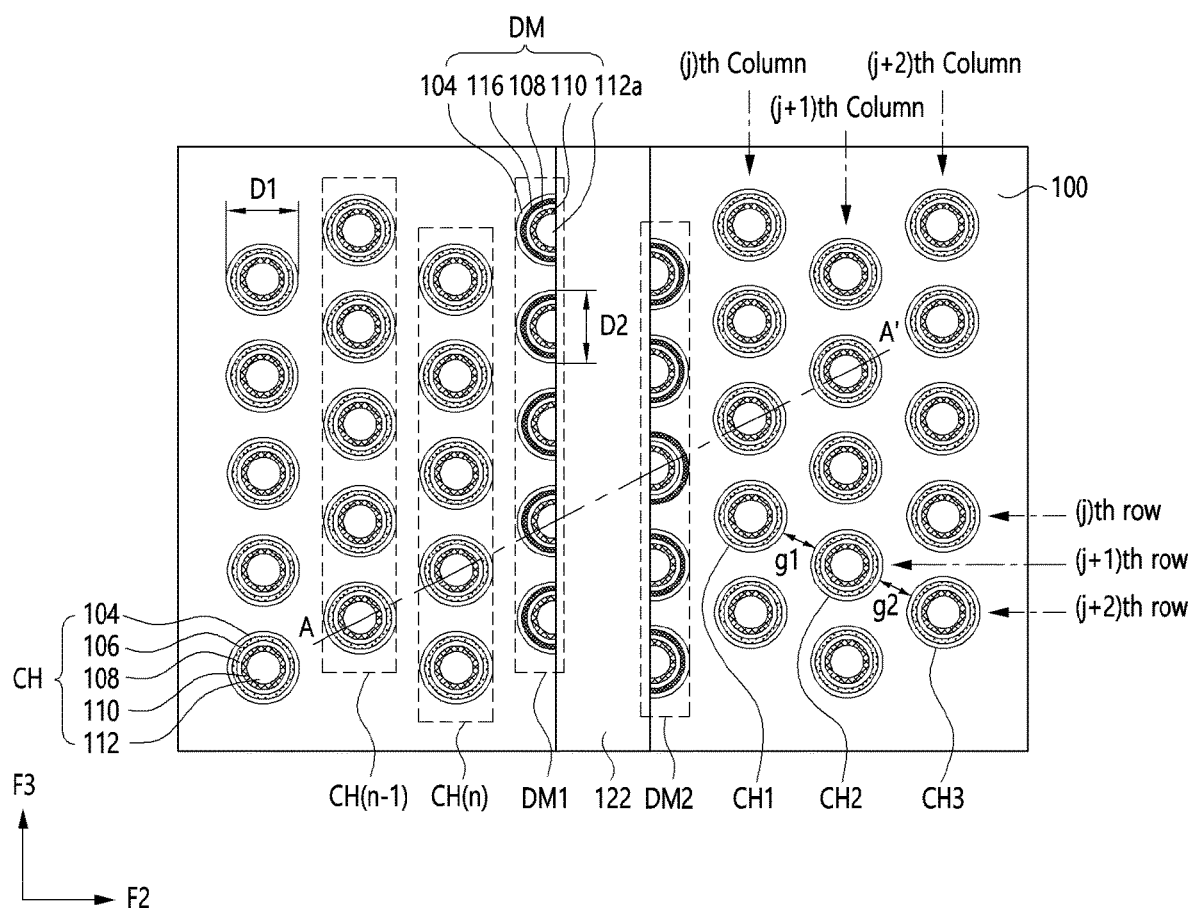
FIGS. 1A and 1B are views illustrating a 3D semiconductor device in accordance with example embodiments.
Figure 1B:
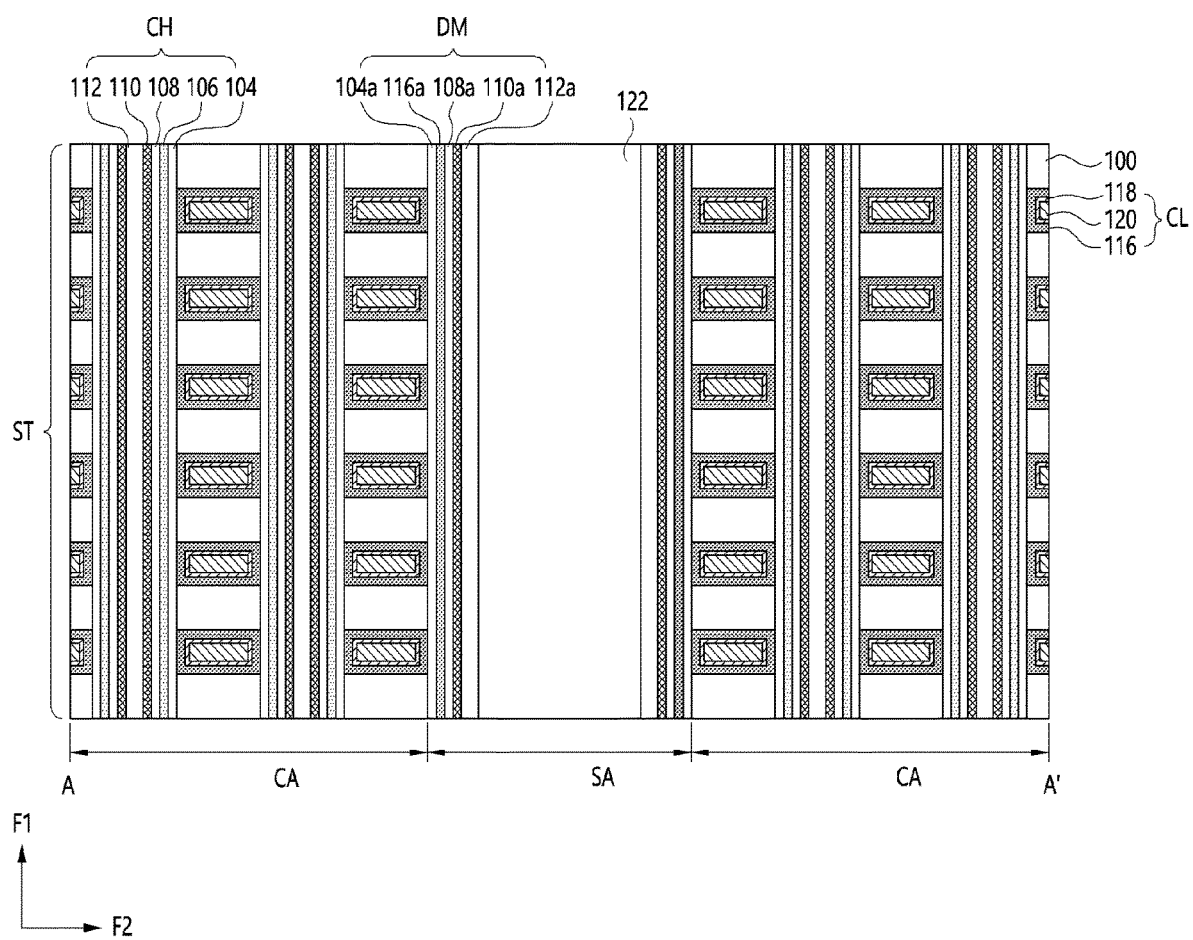

FIGS. 1A and 1B are views illustrating a 3D semiconductor device in accordance with example embodiments. FIG. 1A is a plan view illustrating the 3D semiconductor device. FIG. 1B is a cross-sectional view taken along a line A-A' in FIG. 1A.

Referring to FIGS. 1A and 1B, a 3D semiconductor device may include a stack structure ST, a plurality of channel plugs CH, and a slit structure 122.

The stack structure ST may include a plurality of conductive layers CL and a plurality of insulation layers 100. Each of the conductive layers CL and each of the insulation layers 100 may be alternately stacked at least twice in a vertical direction. The insulation layers 100 may function as to electrically isolate the conductive layers CL from each other. The vertical direction may be a first direction F1.

The conductive layers CL may include at least one conductive material layer, such as, polysilicon, tungsten, molybdenum, etc. The insulation layers 100 may include an insulation material such as oxide, nitride, an air gap, etc.

Each of the conductive layers CL may include a plurality of layers. In example embodiments, each of the conductive layers CL may include a first conductive layer 116, a second conductive layer 118 and a metal layer 120. The second conductive layer 118 may be configured to surround the metal layer 120. The first conductive layer 116 may be configured to surround the second conductive layer 118. The first conductive layer 116 and the second conductive layer 118 may include metal oxide, metal nitride, metal oxynitride, a combination thereof, etc. The first conductive layer 116 and the second conductive layer 118 may include different materials. For example, the first conductive layer 116 and the second conductive layer 118 may include aluminum oxide, silicon nitride, titanium oxide, titanium nitride, titanium oxynitride, tantalum oxide, tantalum nitride, tantalum oxynitride, molybdenum oxide, molybdenum nitride, molybdenum oxynitride, tungsten oxide, tungsten nitride, tungsten oxynitride, a combination thereof, etc.

Each of the channel plugs CH may be vertically formed through the stack structure ST. Each of the channel plugs CH may have a cylindrical shape. According to FIGS. 1A and 1B, each of the channel plugs CH may have a uniform diameter. In this case, the diameter of each of the channel plugs CH may be a first diameter D1. Alternatively, each of the channel plugs CH may have gradually decreased diameters from up to down in a cross-sectional view of the stack structure ST. As shown in FIG. 1B, although an upper diameter of the channel plugs CH and an lower diameter of the channel plug CH appear to be substantially equal, the upper diameter may be larger than the lower diameter in practice. In this case, the first diameter D1 may be an average diameter of the upper diameter and the lower diameter of the channel plug CH.

In a plan view as the FIG. 1A, the plurality of channel plugs CH may be arranged along a second direction F2 and a third direction F3 which are substantially perpendicular to each other. For example, the second direction F2 may be a row direction and the third direction F3 may be a column direction. In terms of a 3D structure, the first, second and third directions F1, F2 and F3 are perpendicular to each other. n channel plugs CH may be arranged in the third direction F3, and m channel plugs CH may be arranged in the second direction F2, n and m being natural numbers. The channel plugs CH which are arranged in the second and third directions F2 and F3, may be spaced apart from each other by a uniform gap. In example embodiments, a distance g1 between a channel plug CH1 located at a cross point of an (i)th row and a (j)th column and a channel plug CH2 located at a cross point of an (i+1)th row and a (j+1)th column may be substantially the same as a distance g2 between the channel plug CH2 and a channel plug CH3 located at a cross point of an (i+2)th row and a (j+2)th column, i and j being natural numbers. i may be a natural number below n, and j may be a natural number below m. Further, an arrangement of the channel plugs CH in the (j)th column may be substantially the same as an arrangement of the channel plugs CH in the (j+2) column. An arrangement of the channel plugs CH in the (i)th row may be substantially the same as an arrangement of the channel plugs CH in the (i+2) row.

Each of the channel plugs CH may include a channel layer 110 and a channel insulation layer. The channel insulation layer may include memory layers 104, 106, and 108 configured to surround the channel layer 110. In example embodiments, each of the channel plugs CH may further include a core 112 that is formed through the channel layer 110. The channel layer 110 may include a semiconductor material, such as silicon, germanium, a nano structure, etc. The memory layers 104, 106, and 108 may be interposed between the channel and the conductive layers CL. For example, the memory layers 104, 106, and 108 may include a blocking insulation layer 104, a data storage layer 106, and a tunnel insulation layer 108. The blocking insulation layer 104 may be configured to surround the data storage layer 106. The data storage layer 106 may be configured to surround the tunnel insulation layer 108. The tunnel insulation layer 108 may be configured to surround the channel layer 110. The data storage layer 106 may include a material for storing data to be changed through Fowler-Nordheim tunneling. For example, the data storage layer 106 may include a nitride material capable for trapping charges. The blocking insulation layer 104 may include an oxide material for blocking the charges. The tunnel insulation layer 108 may include a thin oxide material for allowing charges-tunneling. The core 112 may include an insulation material, such as the oxide material.

The slit structure 122 may be configured to separate the two adjacent stack structures ST from each other in the second direction F2. The slit structure 122 may extend along the third direction F3. For example, the slit structure 122 may be arranged in a sidewall of the stack structure ST.

In example embodiments, the slit structure 122 may include an insulation material. Alternatively, the slit structure 122 may include a source contact plug (not shown) and an insulation spacer (not shown) configured to surround a sidewall of the source contact plug.

The dummy channel plugs DM may be arranged between the stack structures ST and the slit structure 122. For example, the dummy channel plugs DM may include dummy channel plugs DM_1 that are arranged along a first column and dummy channel plugs DM_2 that are arranged along a second column.

The slit structure 122 may be arranged between the dummy channel plugs DM_1 on the first column and the dummy channel plugs DM_2 on the second column. For example, the slit structure 122 may be formed through a portion of each dummy channel plugs DM_1 and a portion of each dummy channel plugs DM_2, resulting in each of the dummy channel plugs DM_1 and DM_2 being only a portion of the channel plug CH. The slit structure 122 may have a narrow width to reduce a size of the semiconductor device.

The dummy channel plugs DM may be arranged in the stack structure like the arrangement of the channel plugs CH. In example embodiments, the dummy channel plugs DM_1 may have an arrangement substantially the same as an arrangement CH(n−1) of the channel plugs that are arranged on a (n−1)th column. The dummy channel plugs DM2 may have substantially the same arrangement substantially as an arrangement CH(n) of a (n)th column of the channel plugs that are arranged on a (n)th column. Since the dummy channel plugs DM1 and DM2 are arranged between edge channel plugs CH that are arranged to be adjacent to the slit structure 122 and the slit structure 122, defects in the 3D semiconductor device, such as a warpage of the stack structure ST, a deformation of the edge channel plugs CH, an open error, a generation of an abnormal pattern, etc., may be solved with the dummy channel plugs DM1 and DM2.

From a planar viewpoint, each of the dummy channel plugs DM may have a cylindrical shape including a partially cut portion. In example embodiments, in a plan view, each of the dummy channel plugs DM may have a substantially semi-circular shape, not limited thereto. For example, a diameter D2 of the dummy channel plugs DM may be substantially same as a diameter D1 of each of the channel plugs CH.

Each of the dummy channel plugs DM may include at least one of the channel insulation layer, the channel layer 110, and a material of the conductive layers CL. For example, each of the dummy channel plugs DM may include one of the materials of the plurality of conductive layers CL, a material corresponding to the first conductive layer 116, and at least one of the materials corresponding to the blocking insulation layer 104, the tunnel insulation layer 108, and the channel layer 110.

In example embodiments, each of the dummy channel plugs DM may include a first layer 104a corresponding to the blocking insulation layer 104, a second layer 116a corresponding to the first conductive layer 116, a third layer 108a corresponding to the tunnel insulation layer 108, a fourth layer 110a corresponding to the channel layer 110 and a fifth layer 112a corresponding to the core 112. The first layer 104a may be configured to surround the second layer 116a. The second layer 116a may be configured to surround the third layer 108a. The third layer 108a may be configured to surround the fourth layer 110a. The fourth layer 110a may be configured to surround the fifth layer 112a. The first layer 104a may include a material, such as an oxide that is substantially the same as the material of the blocking insulation layer 104. The second layer 116a may include a material, such as an aluminum oxide that is substantially the same as the material of the first conductive layer 116. The third layer 108a may include a material, such as an oxide that is substantially the same as the material of the tunnel insulation layer 108. The fourth layer 110a may include a material, such as polysilicon that is substantially the same as the material of the channel layer 110a. The fifth layer 112a may include a material, such as an oxide that is substantially the same as the material of the core 112.

According to example embodiments, the dummy channel plugs DM including the material of the first conductive layer 116a may be positioned between the edge channel plugs CH and the slit structure 122. Thus, the dummy channel plugs DM may function as a support to suppress a warpage of the edge channel plugs CH that are near the slit structure 122, thereby preventing warpage problems for the semiconductor device.

Hereinafter, a method of manufacturing a 3D semiconductor device in accordance with example embodiments may be illustrated with reference to drawings.

FIGS. 2A, 2B, 3A, 3B, 4A, 4B, 5A, 5B, 6A, 6B, 7A, 7B, 8A, 8B, 9A, and 9B are views illustrating a method of manufacturing a 3D semiconductor device in accordance with example embodiments. FIGS. 2A, 3A, 4A, 5A, 6A, 7A, 8A, and 9A are plan views. FIGS. 2B, 3B, 4B, 5B, 6B, 7B, 8B, and 9B are cross-sectional views taken along a line A-A' in FIGS. 2A, 3A, 4A, 5A, 6A, 7A, 8A, and 9A, respectively.

Figure 2A:
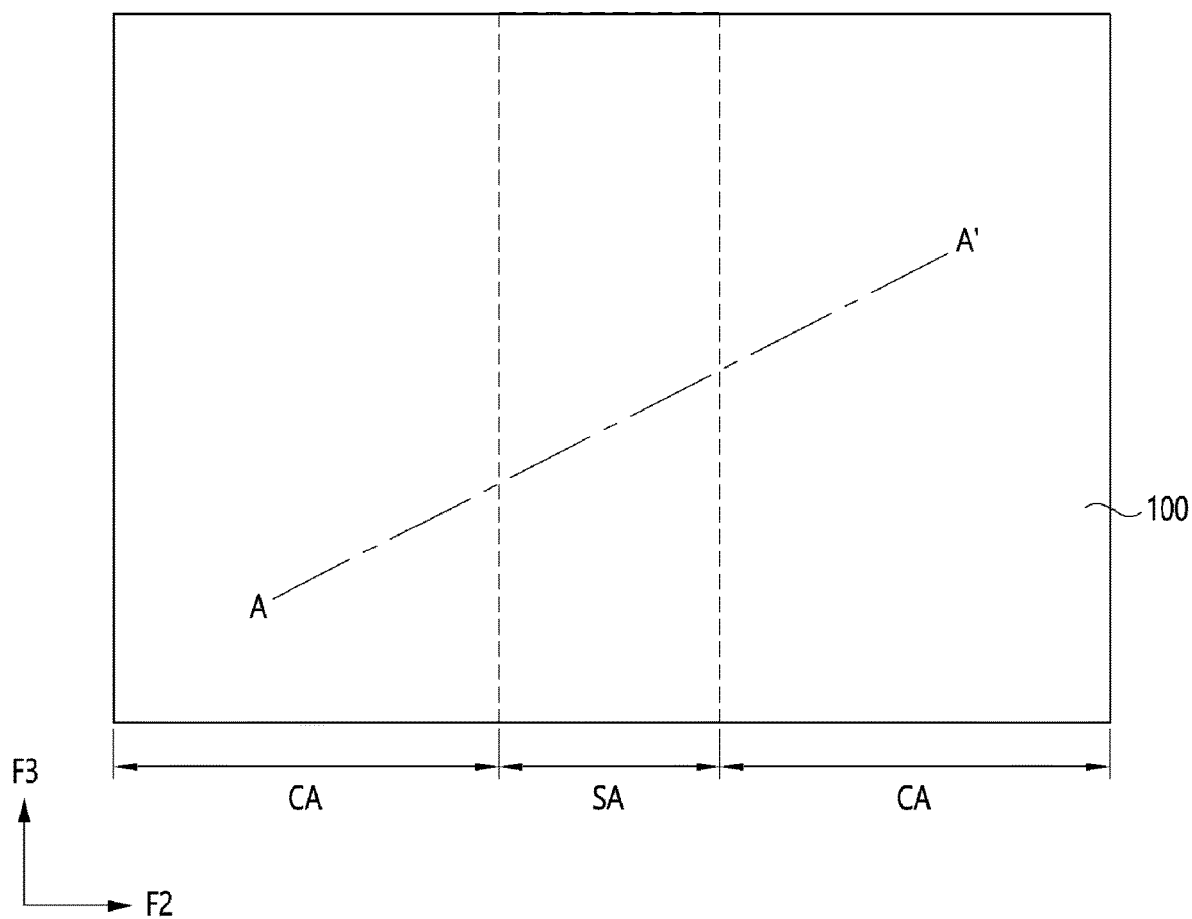
FIGS. 2A, 2B, 3A, 3B, 4A, 4B, 5A, 5B, 6A, 6B, 7A, 7B, 8A, 8B, 9A and 9B are views illustrating a method of manufacturing a 3D semiconductor device in accordance with example embodiments.
Figure 2B:
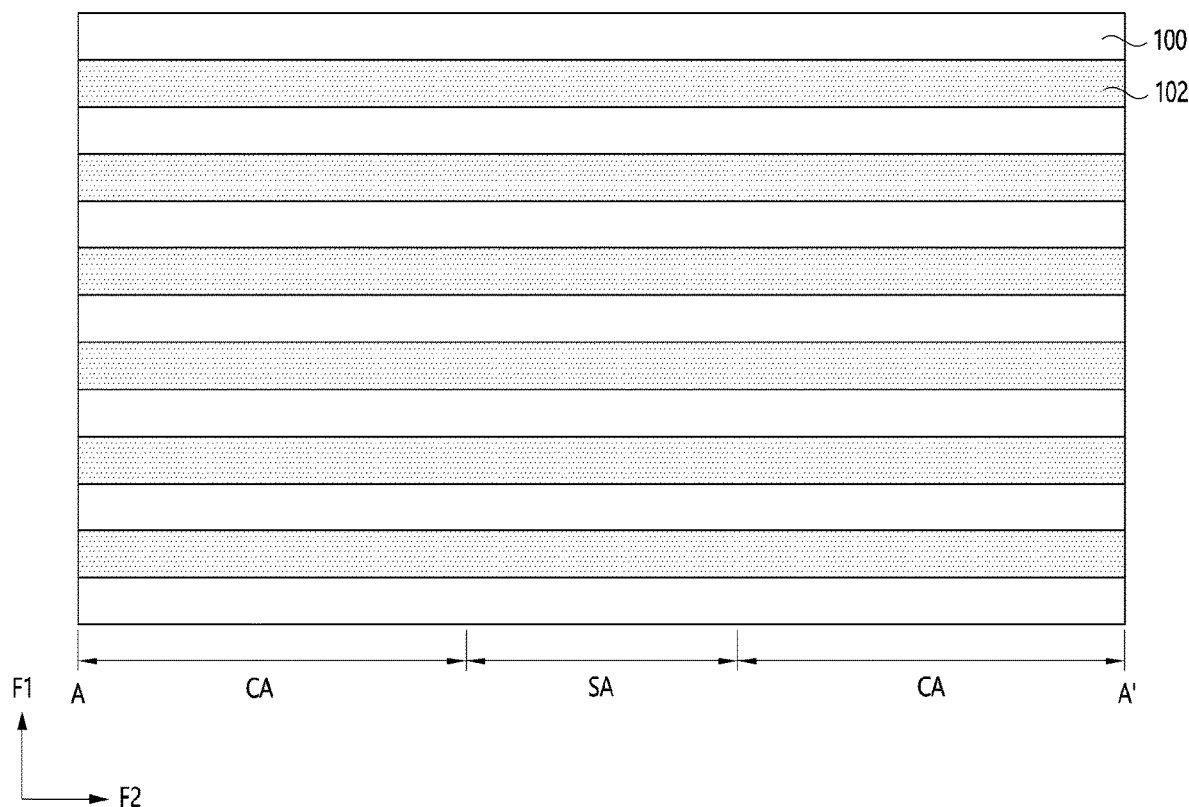

Referring to FIGS. 2A and 2B, the insulation layers 100 and the sacrificial layers 102 may be alternately stacked. Each of the insulation layers 100 may include the oxide material. The sacrificial layers 102 may include a material having an etch selectivity with respect to an etchant for the insulation layers 100. For example, the sacrificial layers 102 may include a nitride material.

The stacked insulation layers 100 and the sacrificial layers 102 may include a cell area CA and a slit area SA.

Figure 3A:
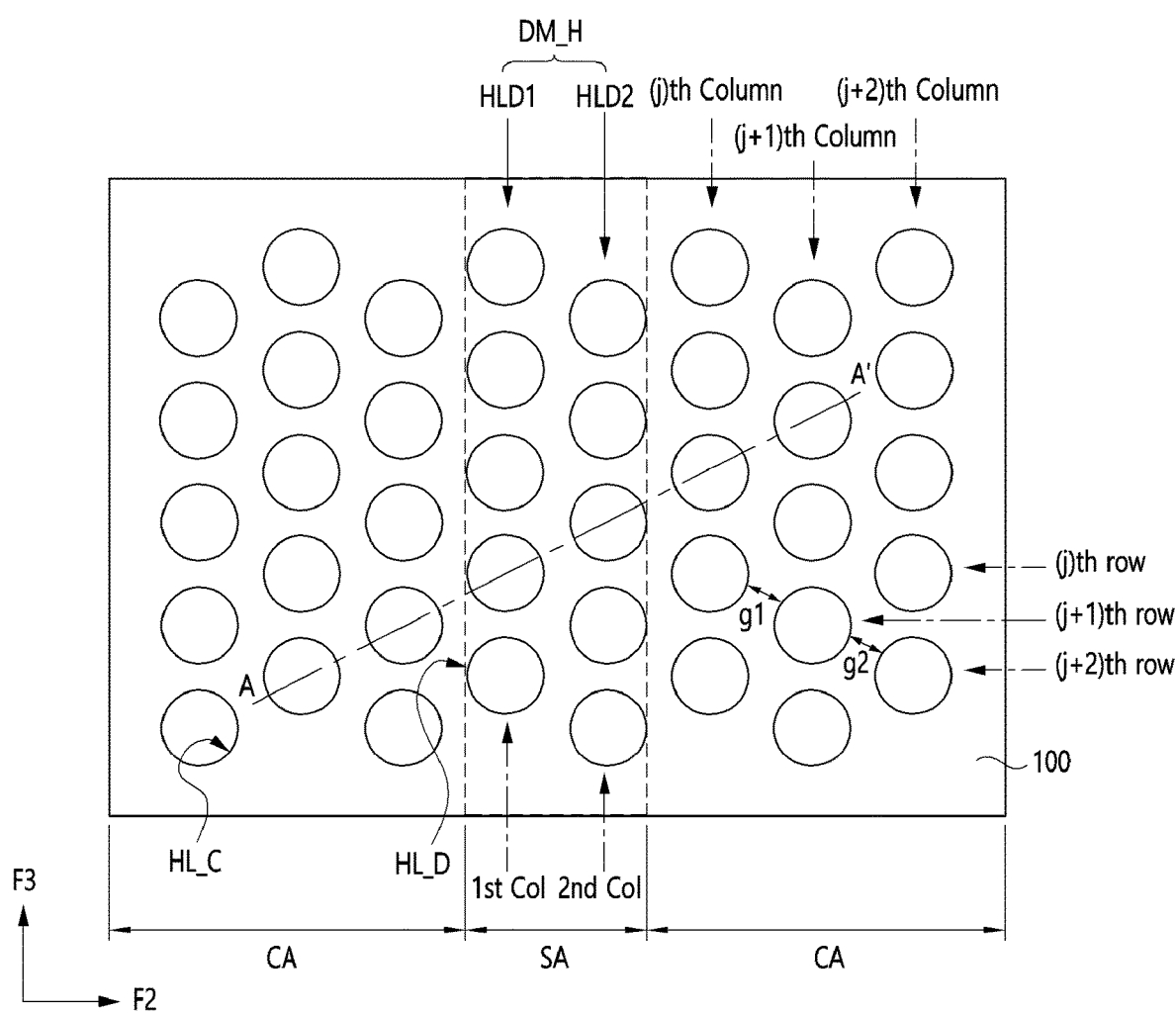
Figure 3B:
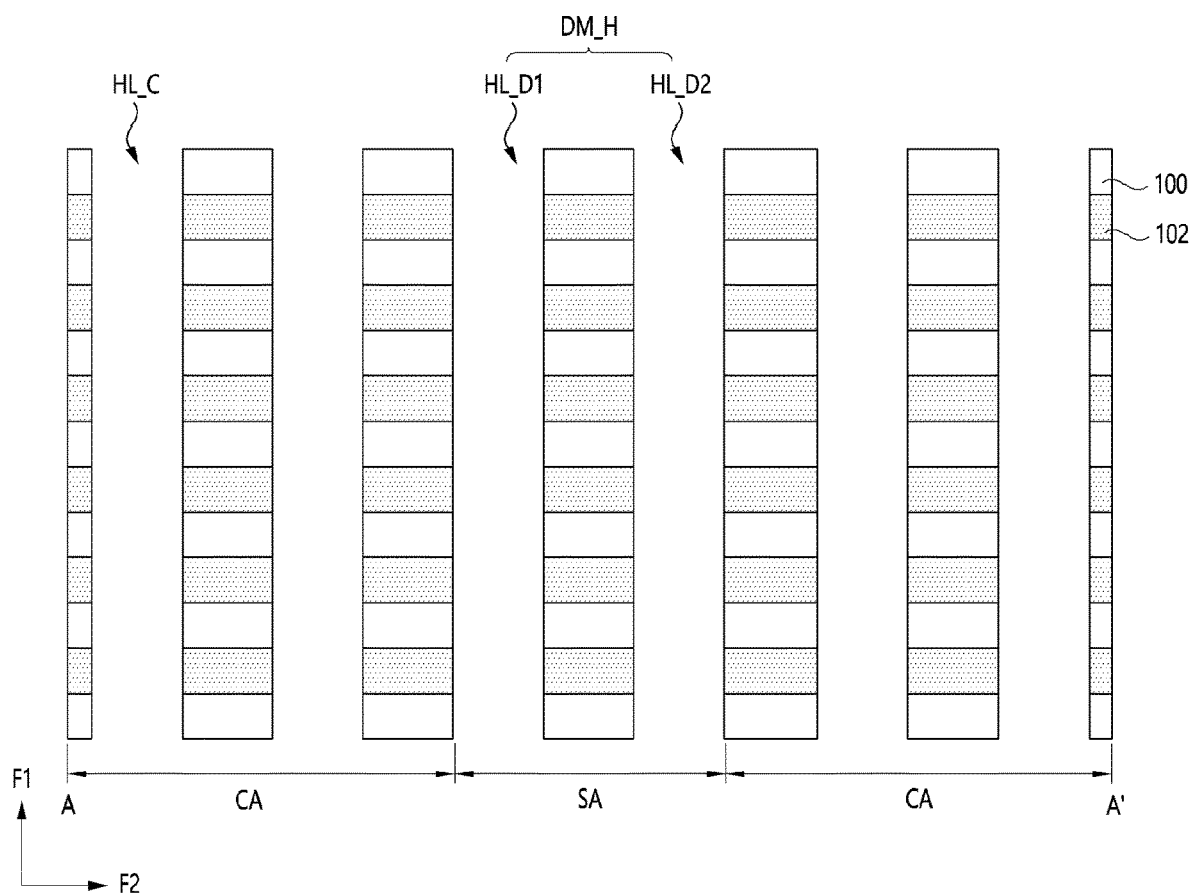

Referring to FIGS. 3A and 3B, the insulation layers 100 and the sacrificial layers 102 may be etched to form a plurality of holes HL_C and HL_D through the insulation layers 100 and the sacrificial layers 102. For example, each of the holes HL_C and HL_D may have a cylindrical shape.

In a planar viewpoint, the holes HL_C and HL_D may be spaced apart from each other in a plurality of rows and columns. For example, the distance g1 between the hole HL_C that is located at the cross point of the (i)th row and the (j)th column and the hole HL_C that is located at the cross point of the (i+1)th row and the (j+1)th column may be substantially the same as the distance g2 between the hole HL_C that is located at the cross point of the (i+1)th row and the (j+1)th column and the hole HL_C that is located at the cross point of the (i+2)th row and the (j+2)th column. An arrangement of the holes HL_C in the (j)th column may be substantially the same as an arrangement of the holes HL_C in the (j+2)th column. An arrangement of the holes HL_C and HL_D in the (i)th row may be substantially the same as an arrangement of the holes HL_C and HL_D in the (i+2)th row.

The holes HL_C and HL_D may include cell holes HL_C in the cell area CA and dummy holes DM_H in the slit area SA. The dummy holes DM_H in the slit area SA may include dummy holes HL_D1 in the first column and dummy holes HL_D2 in the second column.

Figure 4A:
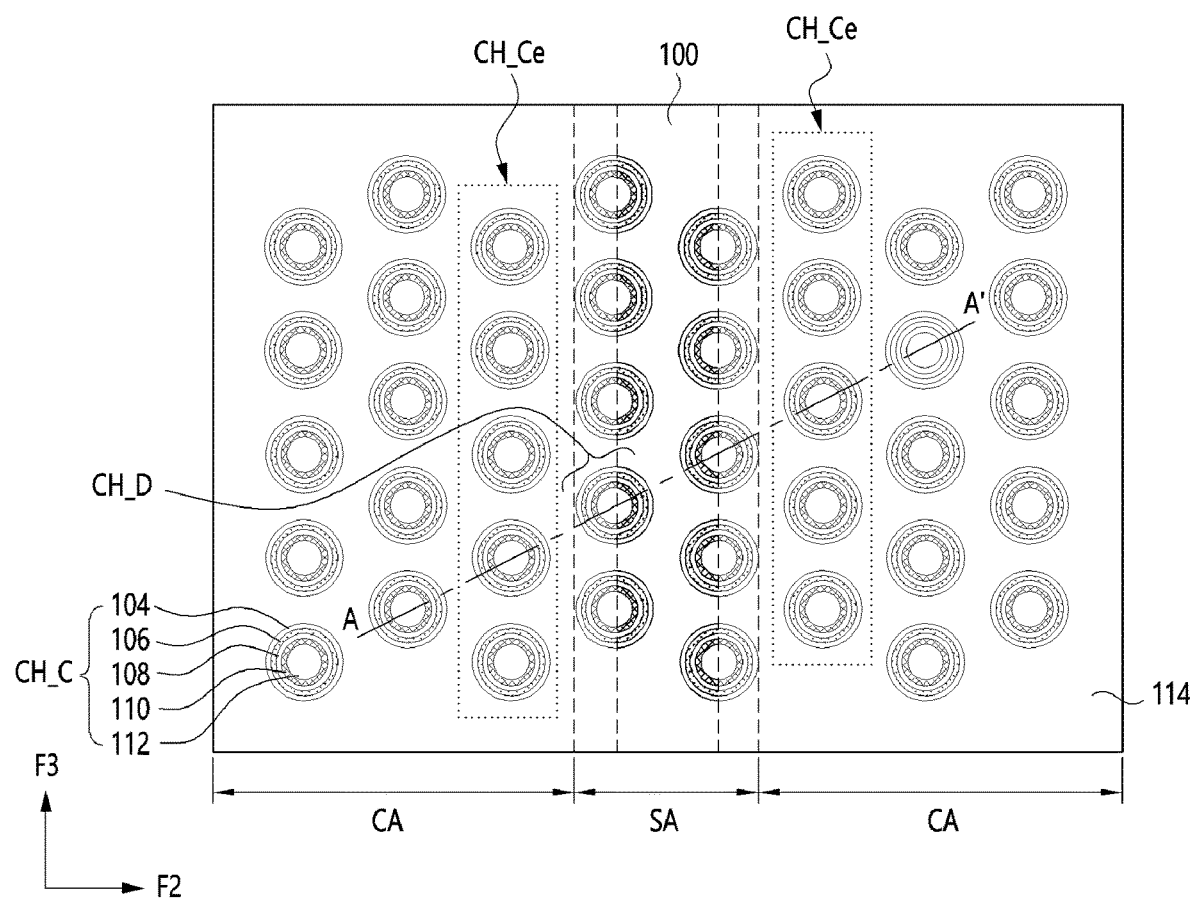
Figure 4B:
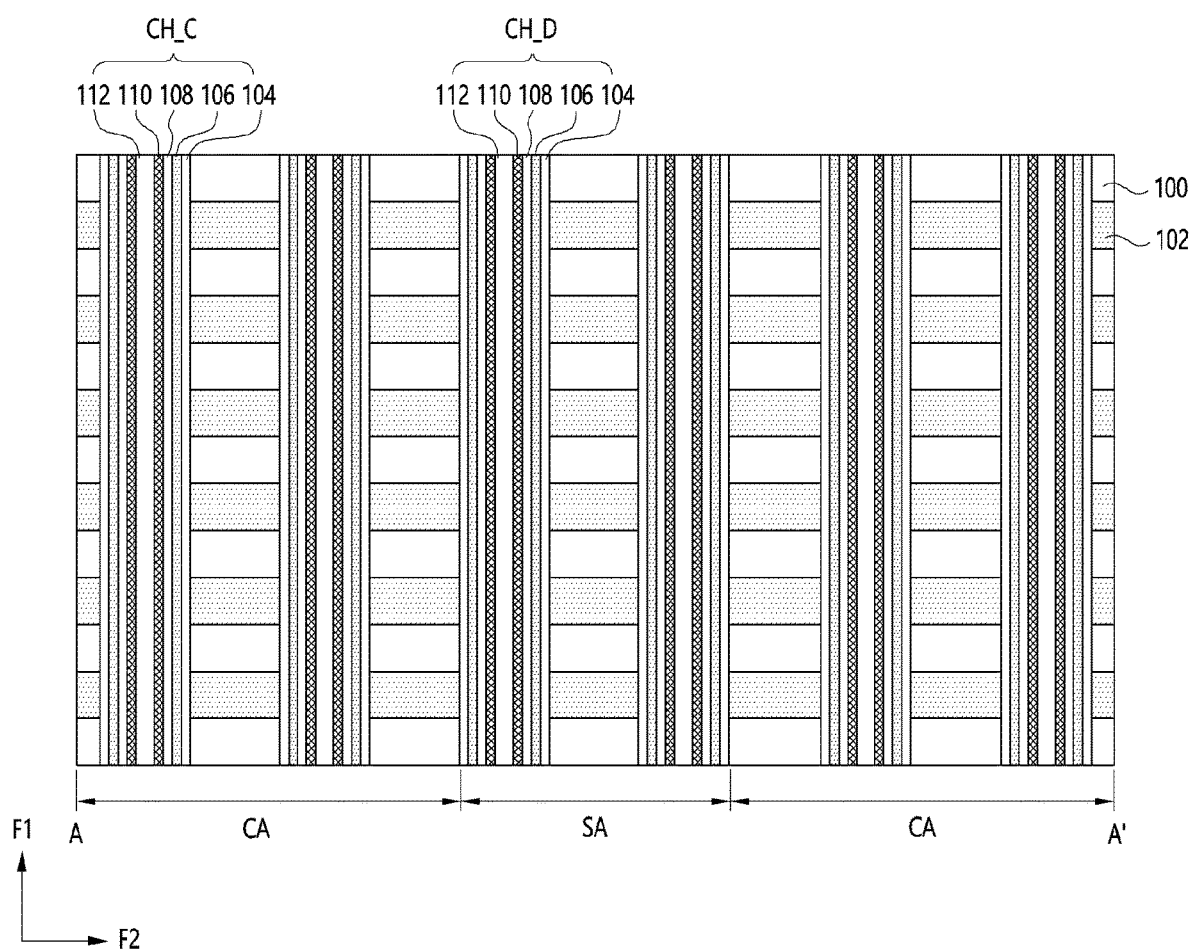

Referring to FIGS. 4A and 4B, a plurality of cell channel plugs CH_C and a plurality of dummy channel plugs CH_D may be formed in the cell holes HL_C and the dummy holes DM_H, respectively.

The cell channel plugs CH_C and the dummy channel plugs CH_D may be formed together with each other through the same process. For example, the memory layers 104, 106, and 108 and the channel layer 110 may be conformally formed along inner surfaces of the cell holes HL_C and the dummy holes HL_D. The core 112 may be formed in the holes HL_C and HL_D that are covered with the memory layers 104, 106, and 108 and the channel layer 110. The core 112 may include an insulating material.

As described above, the memory layers 104, 106, and 108 may include the blocking insulation layer 104, the data storage layer 106, and the tunnel insulation layer 108. The blocking insulation layer 104 may include the oxide material. The data storage layer 106 may include the nitride material. The tunnel insulation layer 108 may include the oxide material. The channel layer 110 may include a semiconductor material, such as polysilicon with conductive dopant. The core 112 may include the oxide material.

The dummy channel plugs CH_D may be formed together with the cell channel plugs CH_C so that the edge cell channel plugs CH_Ce that are adjacent to the slit area SA and the cell channel plugs CH_C in the cell area CA excluding the edge cell channel plugs CH_Ce may be uniformly formed.

Figure 5A:
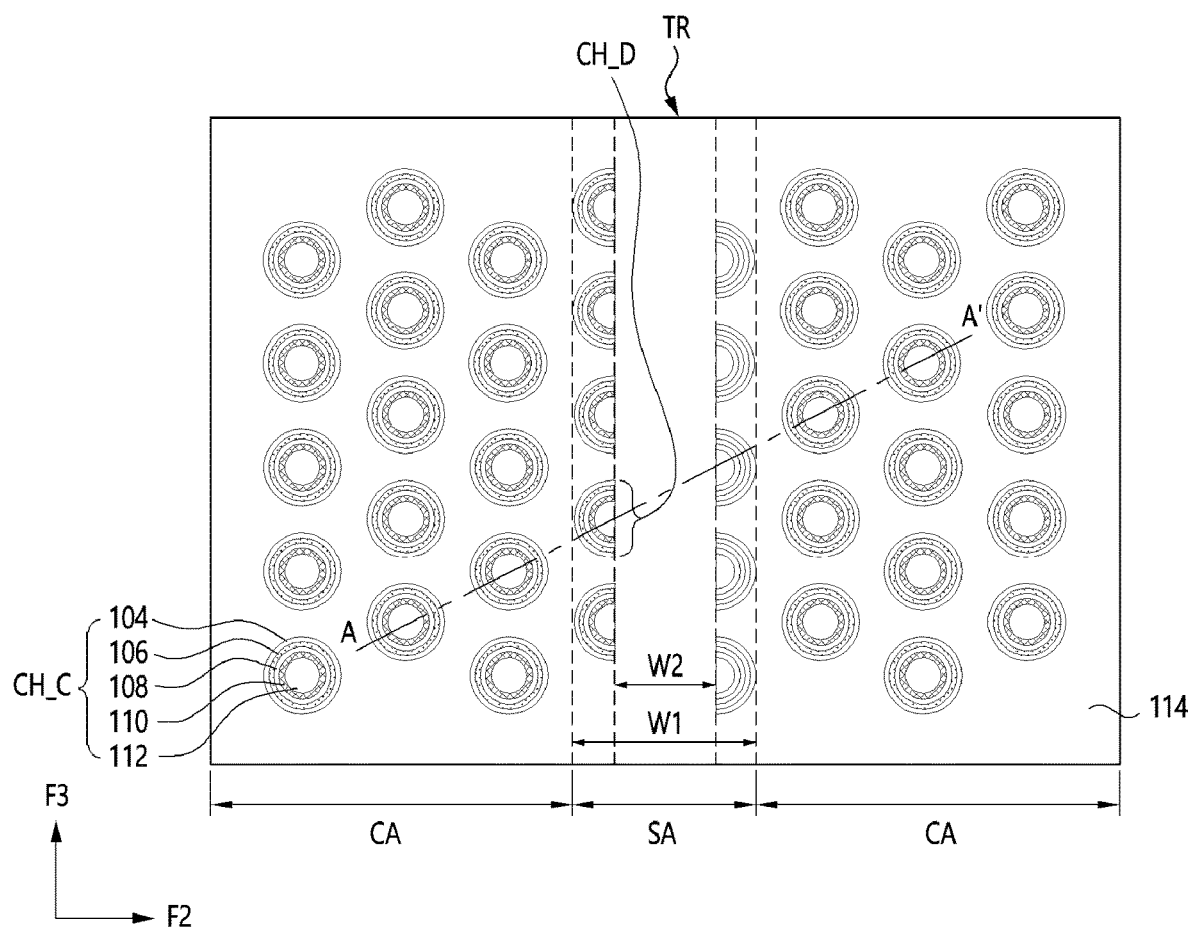
Figure 5B:
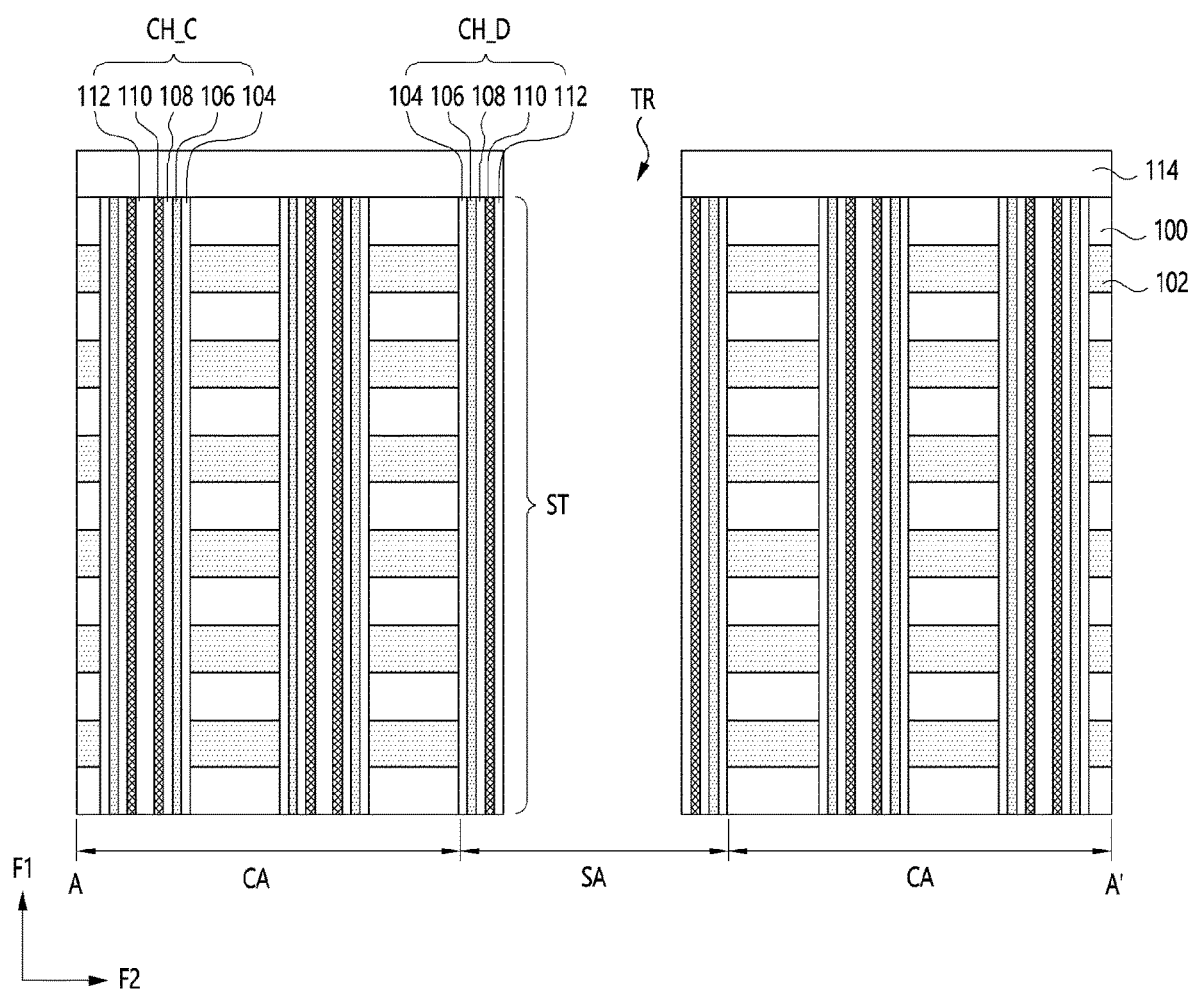

Referring to FIGS. 5A and 5B, the insulation layers 100 and the sacrificial layers 102, which include the cell channel plugs CH_C and the dummy channel plugs CH_D, may be etched to form a trench TR in the slit area SA. The plurality of the stack structures ST may be defined by the trench TR. A reference numeral 114 denotes a mask pattern for defining the trench TR.

In example embodiments, a portion of each of the dummy channel plugs CH_D at the first and second columns may be removed by forming the trench TR. For example, the trench TR may be formed in the slit area SA, and a width W2 of the trench TR may be narrower than a width W1 of the slit area SA. Thus, inner cross-sections of the dummy channel plugs CH_D at the first and second columns may be exposed through the trench TR. Thus, the trench TR may serve as a frame for forming the slit structure.

Figure 6A:
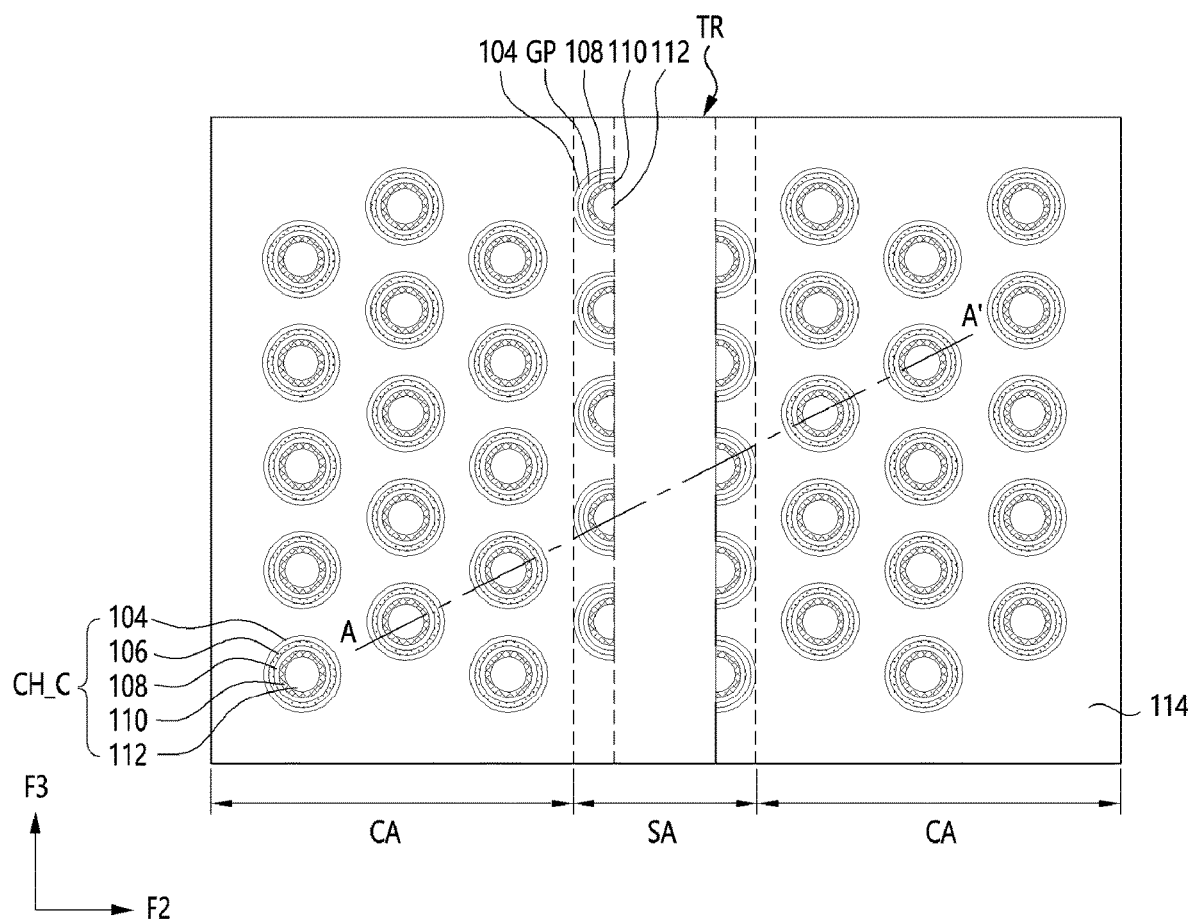
Figure 6B:
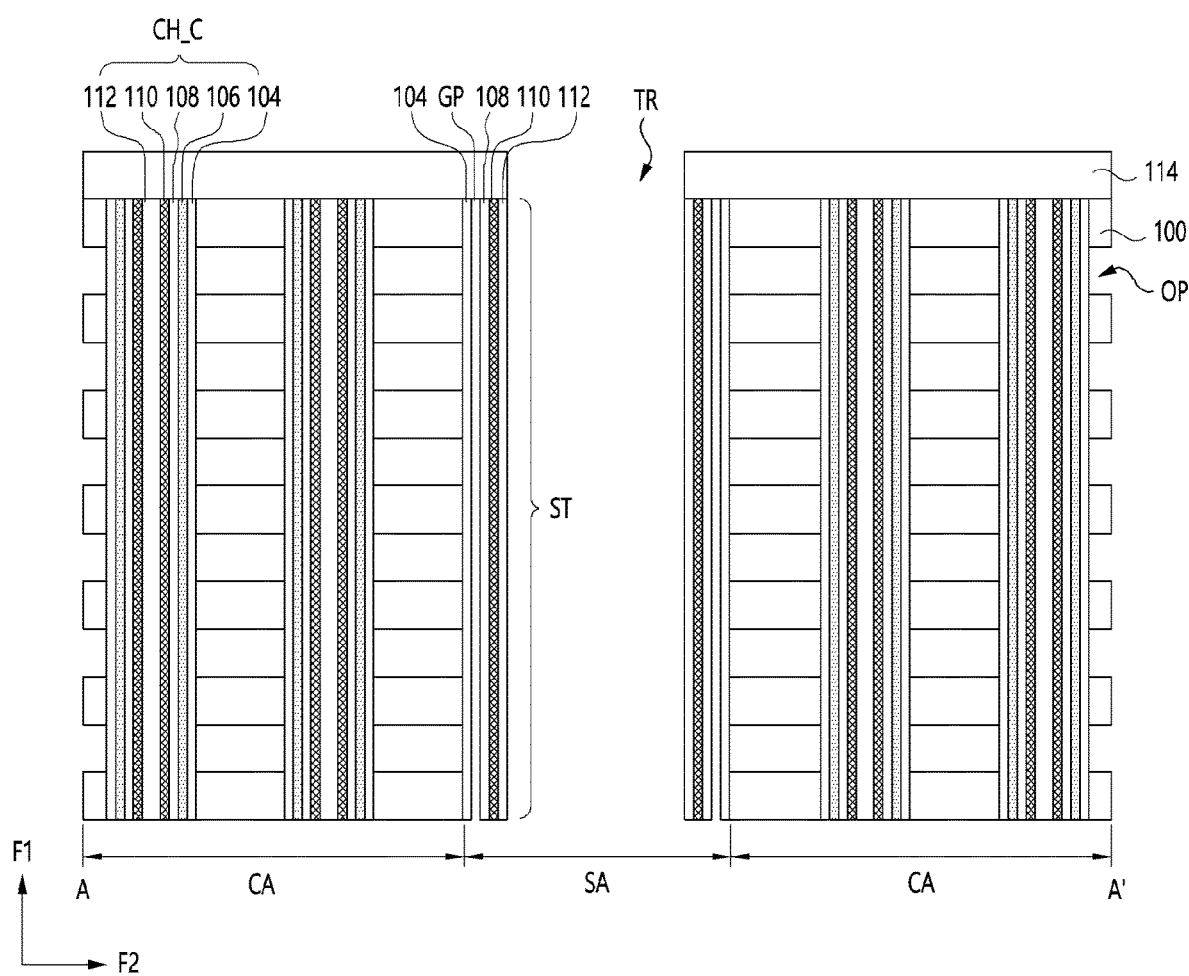

Referring to FIGS. 6A and 6B, the sacrificial layers 102 of the stack structures ST may be selectively removed to define openings OP between the insulation layers 100.

In example embodiments, the sacrificial layers 102 may be exposed through sidewalls of the trench TR. Since etch selectivity of the insulating layer 100 and the sacrificial layer 102 are different, the sacrificial layers 102 may be selectively removed. While the sacrificial layers 102 is being removed, the data storage layer 106 that is made of the same material as the sacrificial layer 102 of each of the dummy channel plugs CH_D may be removed to form a gap GP between the blocking insulation layer 104 and the tunnel insulation layer 108 of each of the dummy channel plugs CH_D.

Figure 7A:
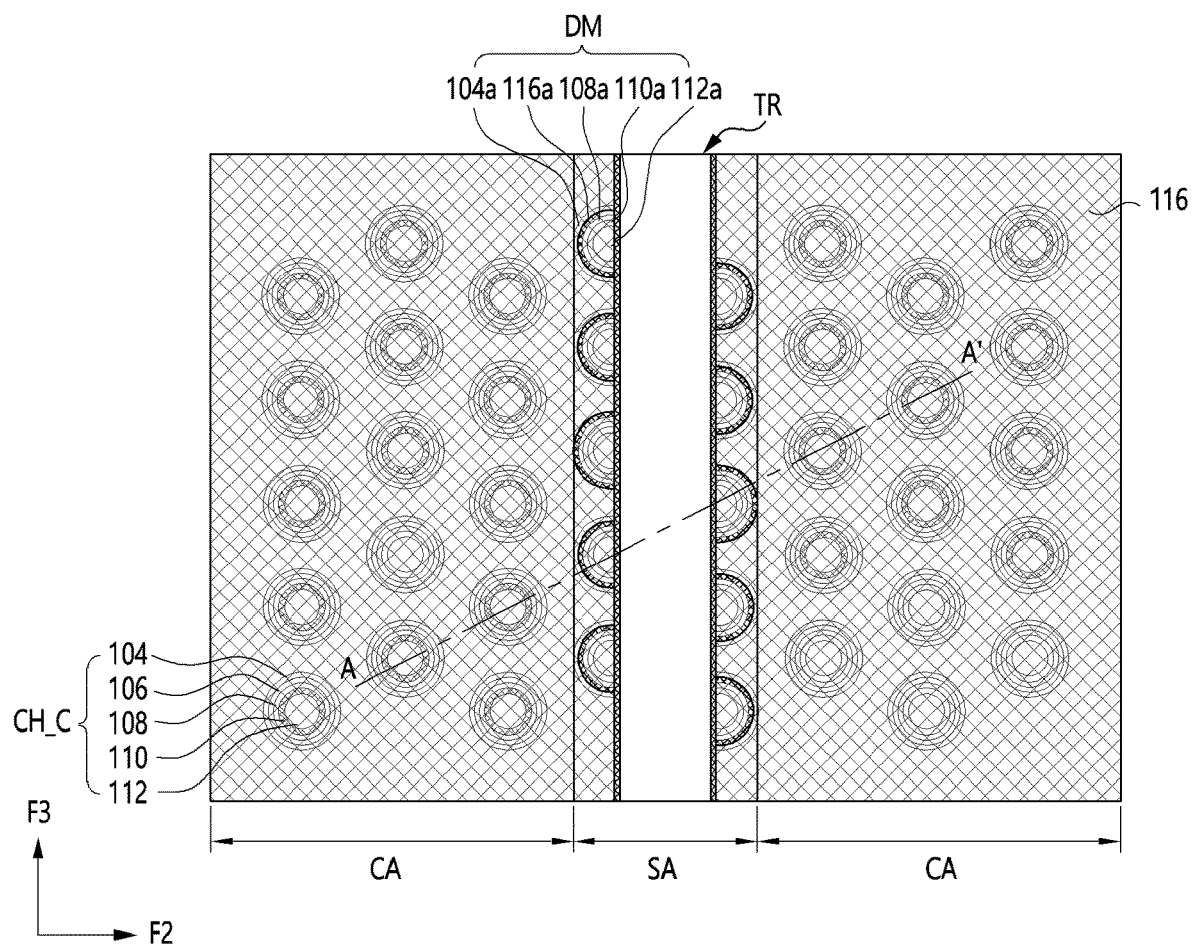
Figure 7B:
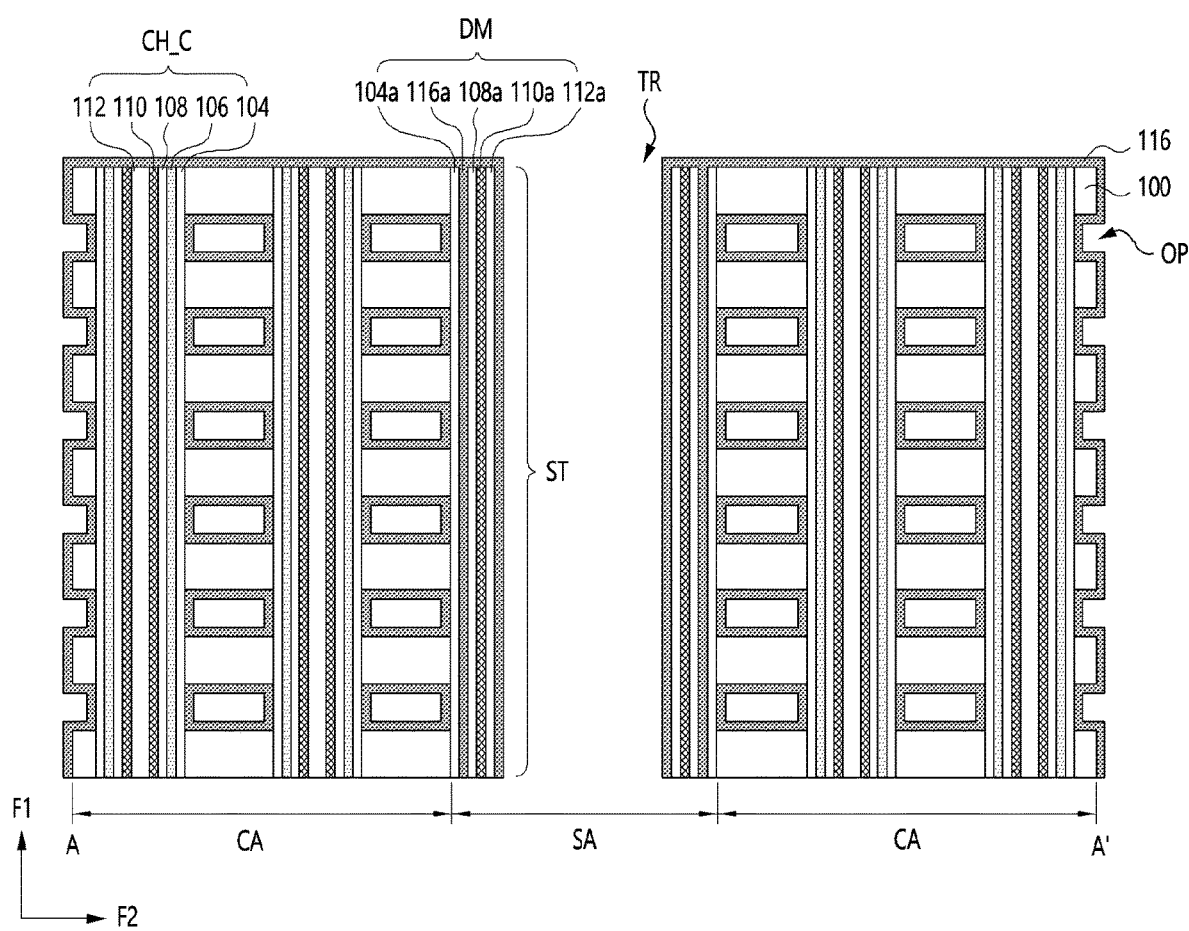

Referring to FIGS. 7A and 7B, the first conductive layer 116 may be conformally formed on the openings OP of the stack structures ST.

While the first conductive layer 116 is conformally formed in the openings OP, the gap GP of each of the dummy channel plugs CH_D may be filled with the first conductive layer 116 to form the dummy channel plugs DM. Here, the blocking insulation layer 104 of the dummy channel plugs CH_D may be the first layer 104a, the first conductive layer 116 of the dummy channel plugs CH_D may be the second layer 116a, the tunnel insulation layer 108 of the dummy channel plugs CH_D may be the third layer 108a, the channel layer 110 of the channel plugs CH_D may be the fourth layer 110a and the core 112 may be the fifth layer 112a.

In example embodiments, the first conductive layer 116 or 116a may have a hardness that is greater than that of the memory layers 104 and 108 and the channel layer 110. Since the dummy channel plugs DM including the first conductive layer 116a may be formed at edge regions of the stack structure ST, like a stake, the dummy channel plugs DM may function as the support to suppress an warpage that is generated in edge regions of the stack structure ST adjacent to the trench TR.

Figure 8A:
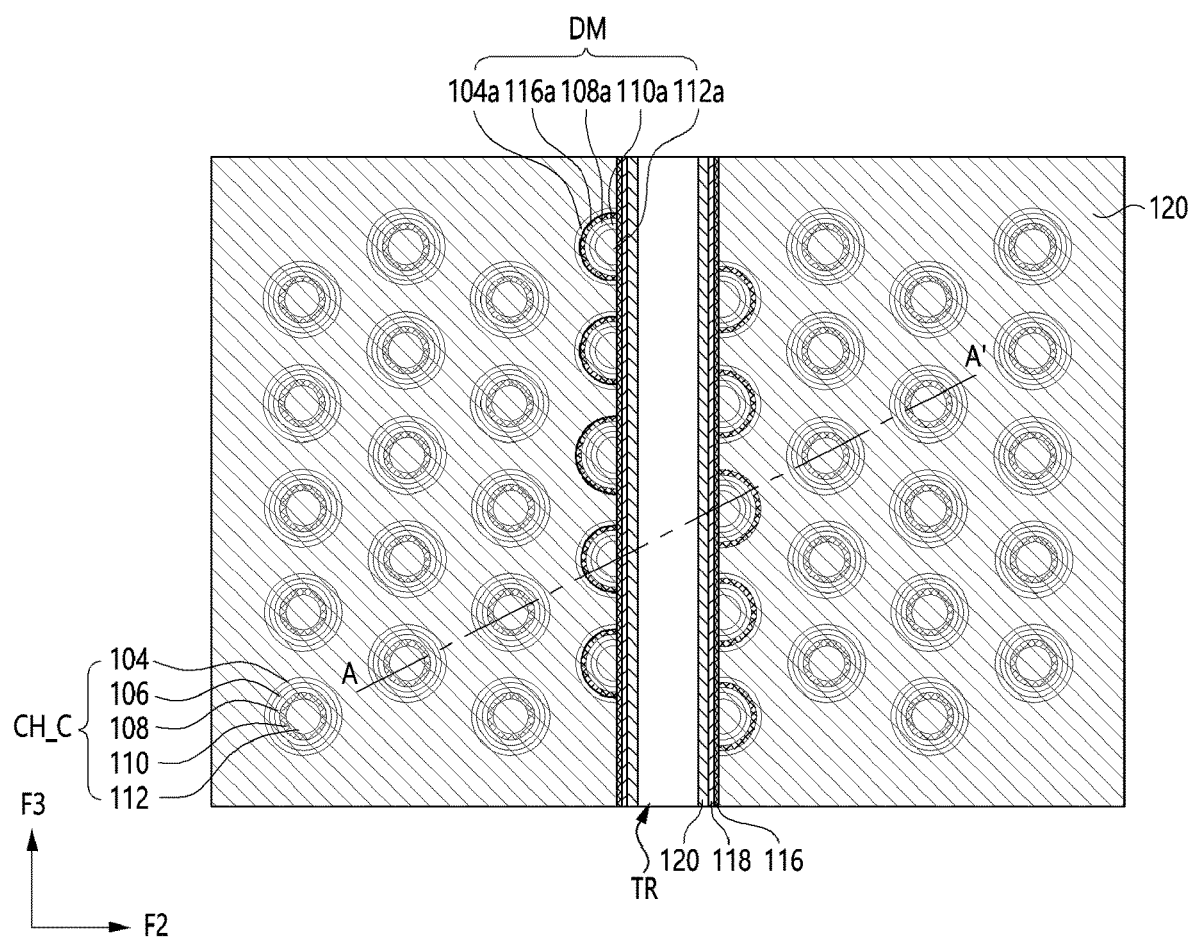
Figure 8B:
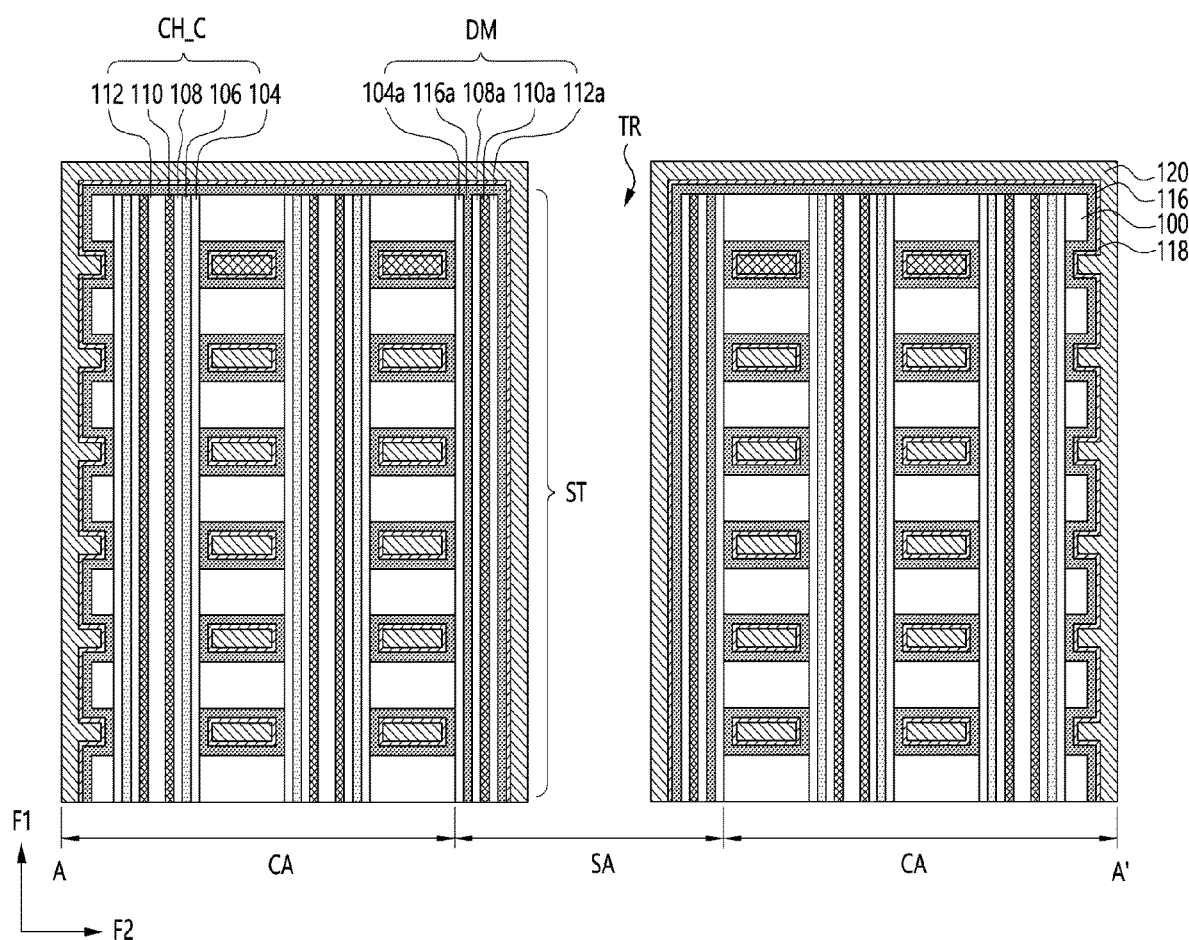

Referring to FIGS. 8A and 8B, the second conductive layer 118 may be conformally formed on the first conductive layer 116 in the openings OP. The metal layer 120 may be formed to fill the openings OP with the second conductive layer 118.

The first conductive layer 116 and the second conductive layer 118 may be different. For example, the first conductive layer 116 and the second conductive layer 118 may include aluminum oxide, silicon nitride, titanium oxide, titanium nitride, titanium oxynitride, tantalum oxide, tantalum nitride, tantalum oxynitride, molybdenum oxide, molybdenum nitride, molybdenum oxynitride, tungsten oxide, tungsten nitride, tungsten oxynitride, a combination thereof, etc. The metal layer 120 may include tungsten, molybdenum, etc.

Figure 9A:
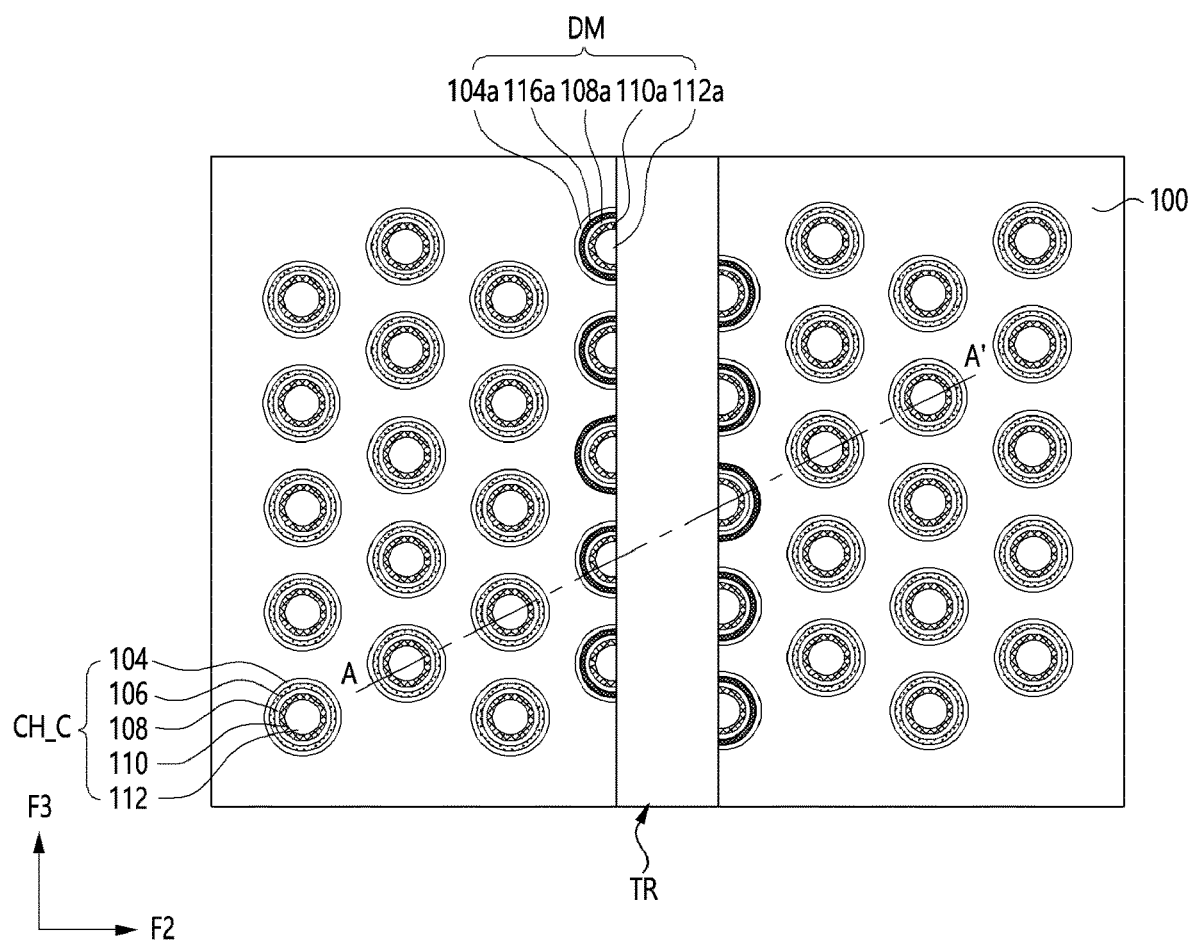
Figure 9B:
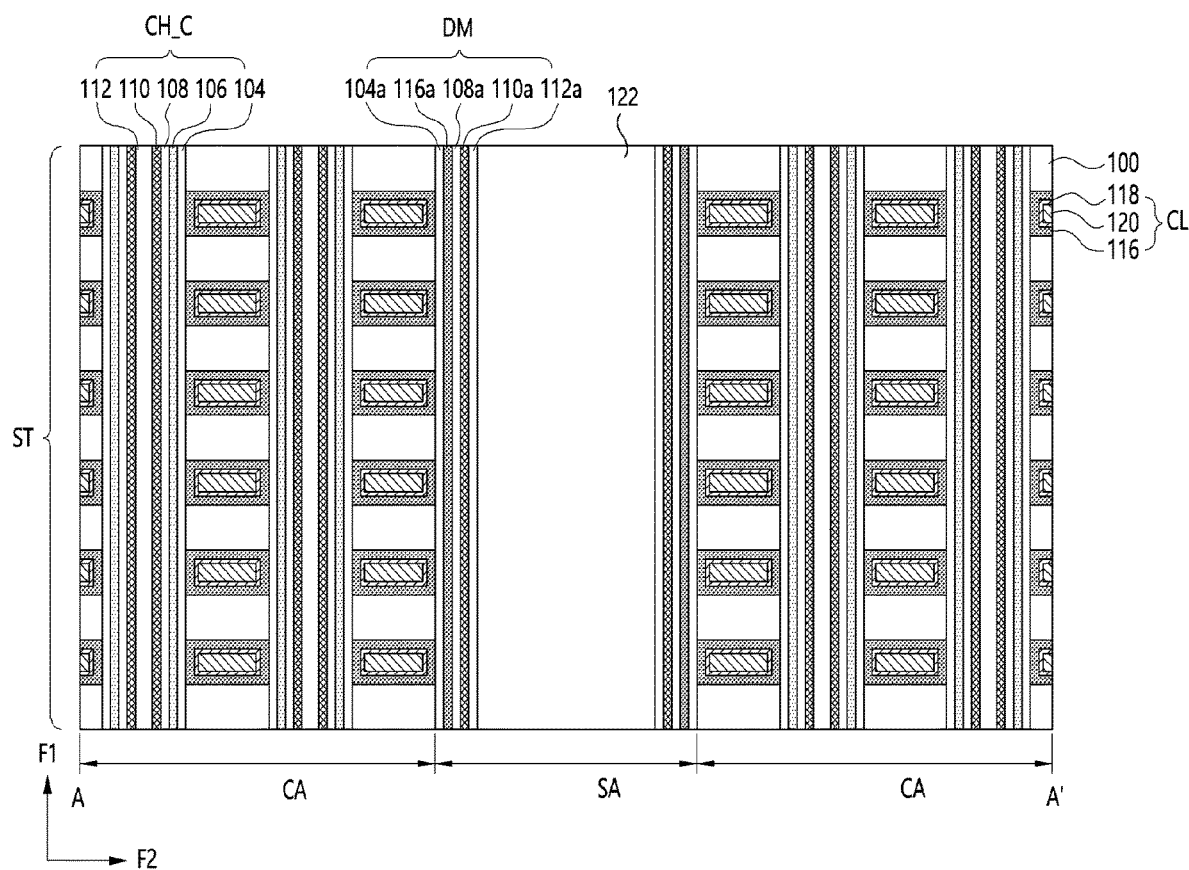

Referring to FIGS. 9A and 9B, the first conductive layer 116, the second conductive layer 118, and the metal layer 120 may be etched until the uppermost insulation layer 100 of the stack structures ST is exposed. The openings OP may be filled with the conductive layers CL including the first conductive layer 116, the second conductive layer 118, and the metal layer 120. Thus, each of the stack structures ST may include the conductive layers CL and the insulation layers 100 that are alternately stacked.

The slit structure 122 may be formed in the trench TR for separating the stack structures ST. For example, the slit structure 122 may include an insulation material. Alternatively, the slit structure 122 may be formed by forming an insulation spacer and by filling the trench TR with a conductive material to form a source contact plug.

Figure 10A:
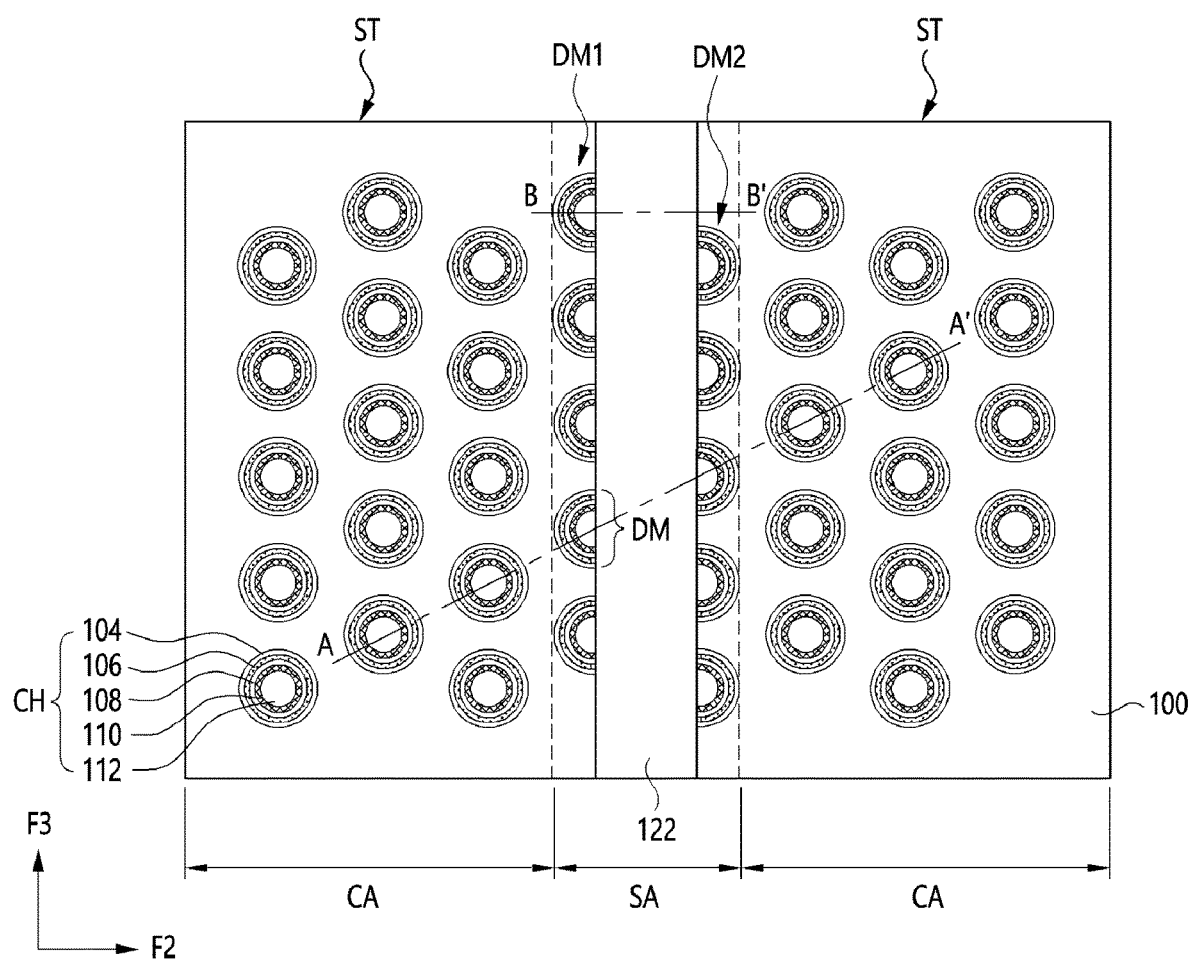
FIGS. 10A to 10C are views illustrating a 3D semiconductor device in accordance with example embodiments.
Figure 10B:
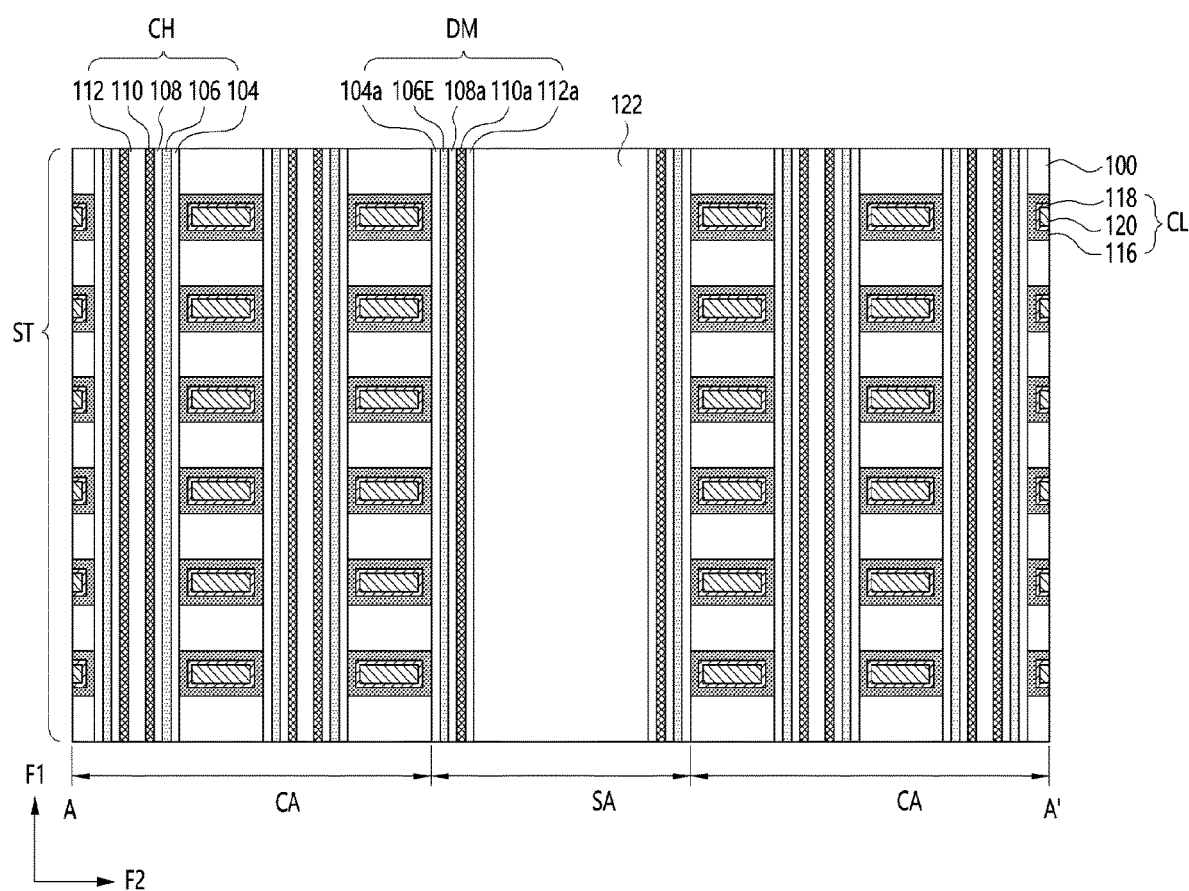
Figure 10C:
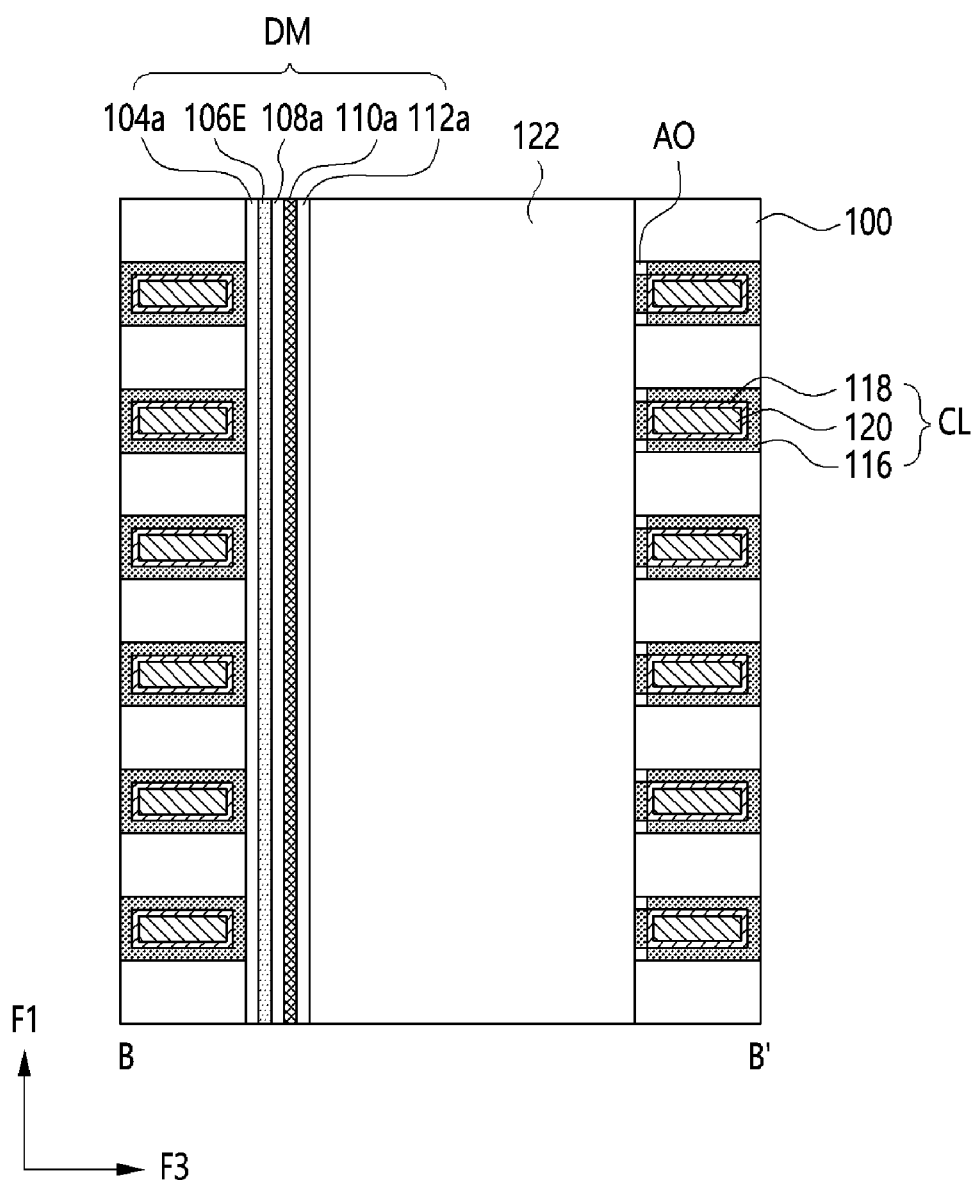

FIGS. 10A to 10C are views illustrating a 3D semiconductor device in accordance with example embodiments. FIG. 10A is a plan view. FIG. 10B is a cross-sectional view taken along a line A-A' in FIG. 10A. FIG. 10C is a cross-sectional view taken along a line B-B' in FIG. 10A.

A 3D semiconductor device in FIGS. 10A to 10C may have a structure that is substantially the same as the structure of the 3D semiconductor device in FIGS. 1A and 1B except for structures of the dummy channel plugs and a slit structure. Thus, the same reference numerals may refer to the same elements and any further illustrations with respect to the same structure may be omitted herein for brevity.

Referring to FIGS. 10A to 10C, a 3D semiconductor device of example embodiments may include a plurality of stack structures ST, a plurality of channel plugs CH and a slit structure 122.

Each of the stack structures ST may include a plurality of conductive layers CL and a plurality of insulation layers 100, each being alternately stacked at least twice in a vertical direction, respectively. The insulation layers 100 may function as to electrically isolate the conductive layers CL from each other. Each of the conductive layers CL may include a first conductive layer 116, a second conductive layer 118 and a metal layer 120. The second conductive layer 118 may be configured to surround the metal layer 120. The first conductive layer 116 may be configured to surround the second conductive layer 118.

The channel plugs CH may be vertically formed through each of the stack structures ST. Each of the channel plugs CH may include a channel layer 110 and memory layers 104, 106, and 108 that are configured to surround the channel layer 110.

The slit structure 122 may separate two adjacent stack structures ST. In a plan view as the FIG. 10A, the slit structure 122 may extend along the third direction F3 corresponding to a column direction. In example embodiments, the dummy channel plug DM may include a first layer 104a, a second layer 106E, a third layer 108a, a fourth layer 110a, and a fifth layer 112a. The dummy channel plug DM may further include a protruded oxide layer AO that is formed at an interface between the plurality of conductive layers CL and the plurality of insulation layers 100 in the stack structure ST making contact with the slit structure 122. The protruded oxide layer AO may make contact with the slit structure 122. The protruded oxide layer AO may be formed within a border formed by the conductive layer CL and the insulation layer 100.

The dummy channel plugs DM may include dummy channel plugs DM1 in a first column and dummy channel plugs DM2 in a second column. Since the dummy channel plugs DM1 and DM2 are arranged between edge channel plugs CH that are arranged to be adjacent to the slit structure 122 and the slit structure 122, defects in the 3D semiconductor device, such as a warpage of the stack structure ST, a deformation of the edge channel plugs CH, an open error, a generation of an abnormal pattern, etc., may be solved with the dummy channel plugs DM1 and DM2.

In a planar viewpoint, each of the dummy channel plugs DM may have a cylindrical shape including a partially cut portion. In example embodiments, in a plan view, each of the dummy channel plugs DM may have a semi-circular shape, not limited thereto. For example, a diameter D2 of the dummy channel plugs DM may be substantially same as a diameter D1 of each of the channel plugs CH.

Figure 10D:
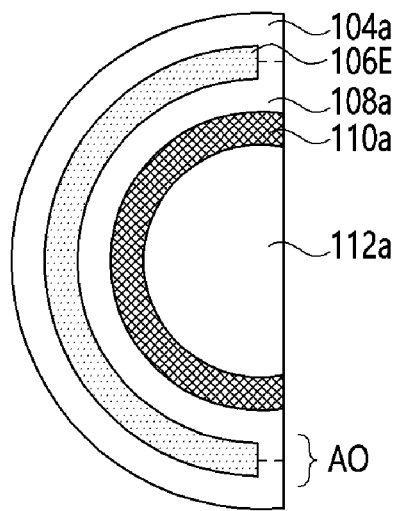
FIGS. 10D to 10F are views illustrating a dummy channel plug of a 3D semiconductor device in accordance with example embodiments.
Figure 10E:
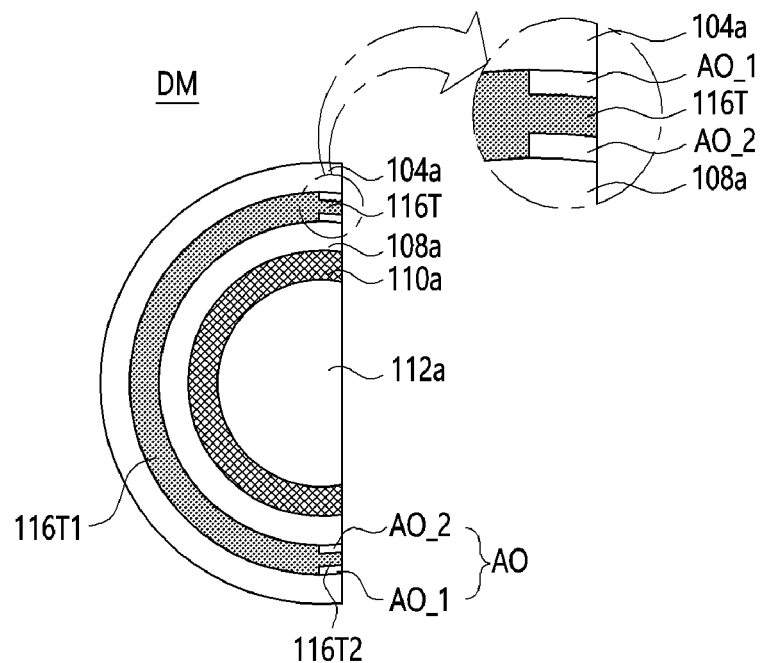
Figure 10F:
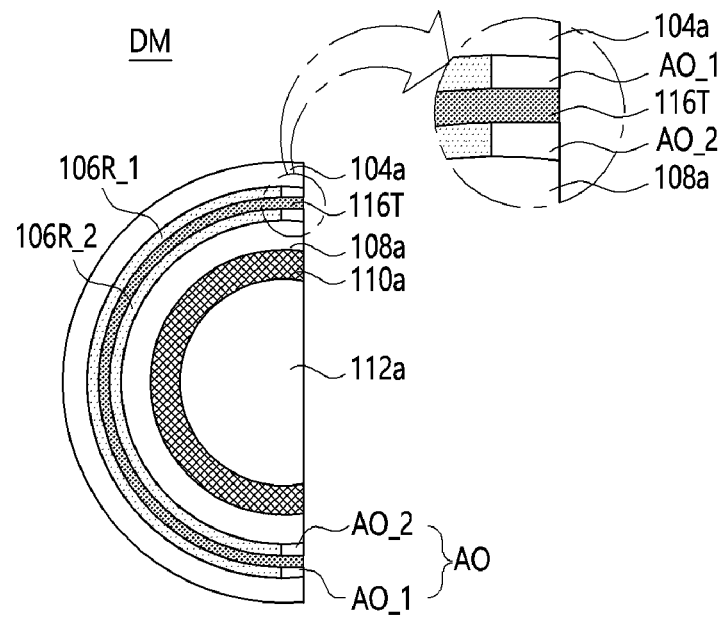

FIGS. 10D to 10F are views illustrating a dummy channel plug of a 3D semiconductor device in accordance with example embodiments.

Referring to FIG. 10D, each of dummy channel plugs DM may include the first layer 104, the second layer 106E, the third layer 108, the fourth layer 110 and the fifth layer 112, as described above. The first layer 104 may be configured to surround the second layer 106E. The second layer 106E may be configured to surround the third layer 108. The third layer 108 may be configured to surround the fourth layer 110. The fourth layer 110 may be configured to surround the fifth layer 112. The first layer 104 may include a material, such as an oxide that is substantially the same as a material of the blocking insulation layer 104. The second layer 106E may include a material, such as a nitride that is substantially the same as a material of the data storage layer 106. The third layer 108 may include a material, such as an oxide that is substantially the same as a material of the tunnel insulation layer 108. The fourth layer 110 may include a material, such as polysilicon that is substantially the same as a material of the channel layer 110. The fifth layer 112 may include a material, such as an oxide that is substantially the same as a material of the core 112. In example embodiments, the first layer 104 and the third layer 108 may be contacted by the protruded oxide layer AO. The second layer 106E may have an inwardly concaved portion so that the second layer 106E might not make contact with the slit structure 112.

Referring to FIG. 10E, each of dummy channel plugs DM of an example embodiment may include a first layer 104, a second layer 116T, a third layer 108, a fourth layer 110, and a fifth layer 112. The first layer 104 may be configured to surround the second layer 116T. The second layer 116T may be configured to surround the third layer 108. The third layer 108 may be configured to surround the fourth layer 110. The fourth layer 110 may be configured to surround the fifth layer 112. The first layer 104 may include a material, such as oxide that is substantially the same as a material of the blocking insulation layer 104. The second layer 116T may include a material, such as an aluminum oxide that is substantially the same as a material of the first conductive layer 116. The third layer 108 may include a material, such as an oxide that is substantially the same as a material of the tunnel insulation layer 108. The fourth layer 110 may include a material, such as polysilicon that is substantially the same as a material of the channel layer 110. The fifth layer 112 may include a material, such as an oxide that is substantially the same as a material of the core 112. In the example embodiment, the protruded oxide layer may include a first protruded oxide layer AO_1 and a second protruded oxide layer AO_2. The first protruded oxide layer AO_1 may protrude from the first layer 104 to the third layer 108. The second protruded oxide layer AO_2 may protrude from the third layer 108 to the first layer 104. The first protruded oxide layer AO_1 might not make contact with the second protruded oxide layer AO_2. The second layer 116T may extend between the first protruded oxide layer AO_1 and the second protruded oxide layer AO_2. The second layer 116T may include a first portion 116T1 and a second portion 116T2. The first portion 116T1 of the second layer 116T may have a first thickness and may be positioned between the first layer 104 and the third layer 108. The second portion 116T2 of the second layer 116T may have a second thickness that is thinner than the first thickness. The second portion 116T2 of the second layer 116T may be positioned between the first protruded oxide layer AO_1 and the second protruded oxide layer AO_2. Edges of the second portion 116T may contact the slit structure 112.

Referring to FIG. 10F, each of dummy channel plugs DM of an example embodiment may include a first layer 104, a second layer 106R_1, a third layer 116T, a fourth layer 106R_2, a fifth layer 108, a sixth layer 110, and a seventh layer 112. The first layer 104 may be configured to surround the second layer 106R_1. The second layer 106R_1 may be configured to surround the third layer 116T. The third layer 116T may be configured to surround the fourth layer 106R_2. The fourth layer 106R_2 may be configured to surround the fifth layer 108. The fifth layer 108 may be configured to surround the sixth layer 110. The sixth layer 110 may be configured to surround the seventh layer 112. The first layer 104 may include a material, such as an oxide that is substantially the same as a material of the blocking insulation layer 104. The second layer 106R_1 may include a material, such as a nitride that is substantially the same as a material of the data storage layer 106. The third layer 116T may include a material, such as an aluminum oxide that is substantially the same as a material of the first conductive layer 116. The fourth layer 106R_2 may include a material, such as a nitride that is substantially the same as a material of the data storage layer 106. The fifth layer 108 may include a material, such as an oxide that is substantially the same as a material of the tunnel insulation layer 108. The sixth layer 110 may include a material, such as polysilicon that is substantially the same as a material of the channel layer 110. The seventh layer 112 may include a material, such as an oxide that is substantially the same as a material of the core 112. In the example embodiment, the protruded oxide layer AO may include a first protruded oxide layer AO_1 and a second protruded oxide layer AO_2. The first protruded oxide layer AO_1 may protrude from the first layer 104 to the fifth layer 108. The second protruded oxide layer AO_2 may protrude from the fifth layer 108 to the first layer 104. The first protruded oxide layer AO_1 might not make contact with the second protruded oxide layer AO_2. The third layer 116T may extend between the first protruded oxide layer AO_1 and the second protruded oxide layer AO_2. The second layer 106R_1 may be covered by the first layer 104 and the first protruded oxide layer AO_1. The third layer 106R_2 may be covered by the fourth layer 108 and the second protruded oxide layer AO_2. The second layer 106R_1 and the third layer 106R_2 might not make contact with the slit structure 112.

Hereinafter, a method of manufacturing a 3D semiconductor device in FIGS. 10A to 10F may be illustrated with reference to drawings.

Figure 11A:
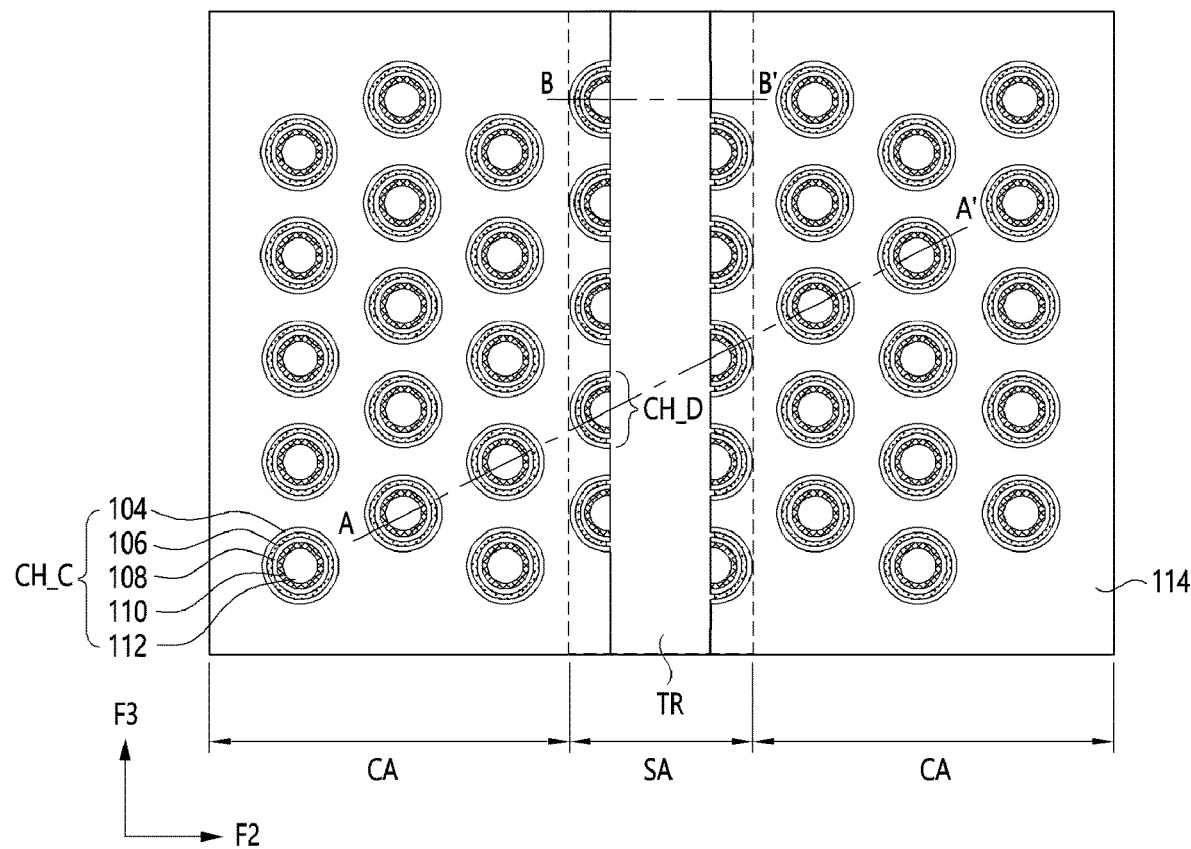
FIGS. 11A, 11B, 11C, 11D, 12A, 12B, 12C, 12D, 12E, 13A, 13B, 13C, 13D, 13E and 13F are views illustrating a method of manufacturing a 3D semiconductor device in accordance with example embodiments.
Figure 11B:
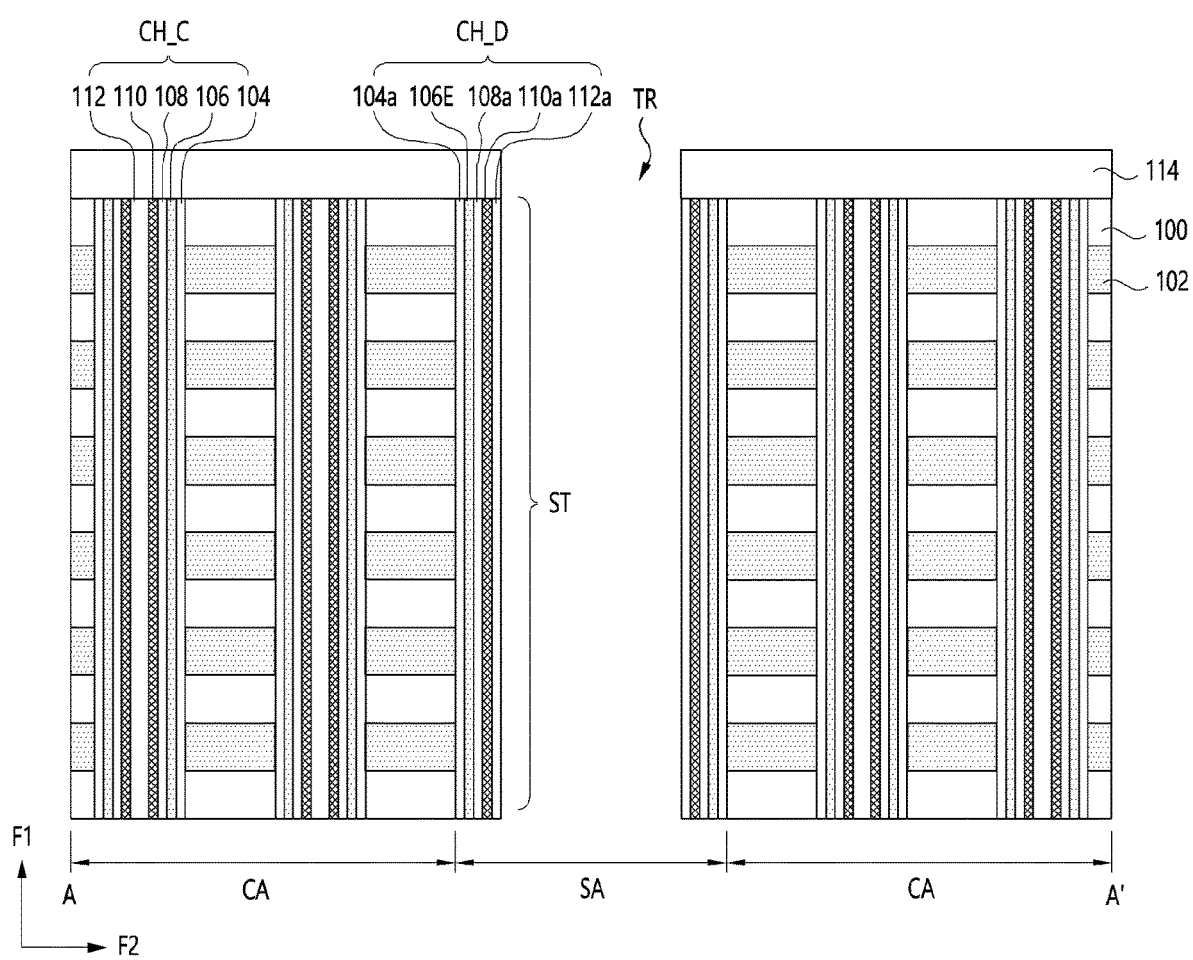
Figure 11C:
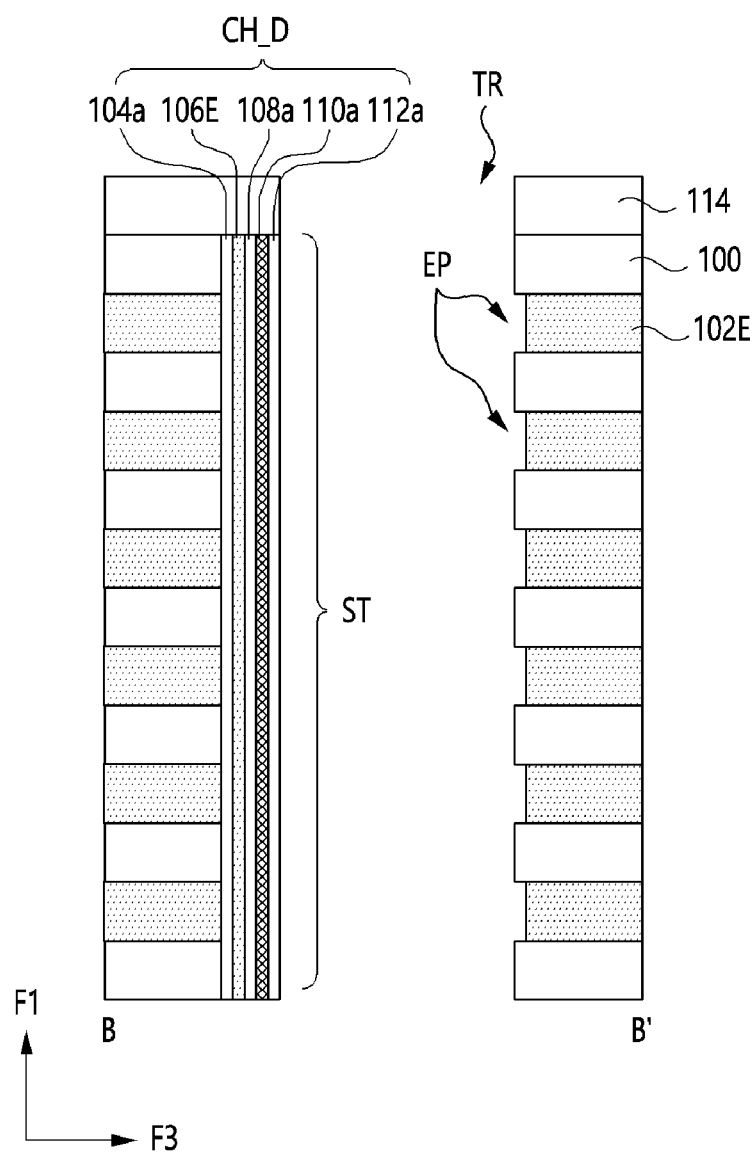
Figure 11D:
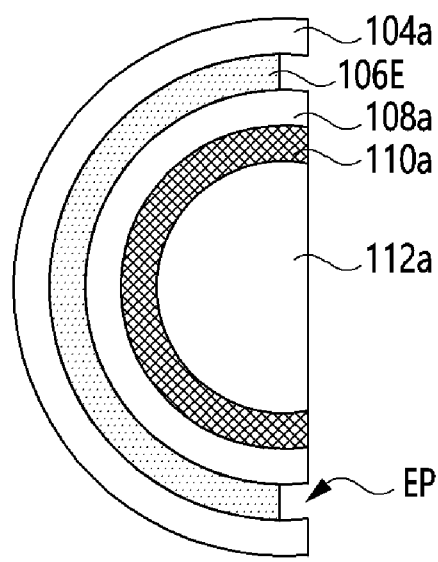
Figure 12A:
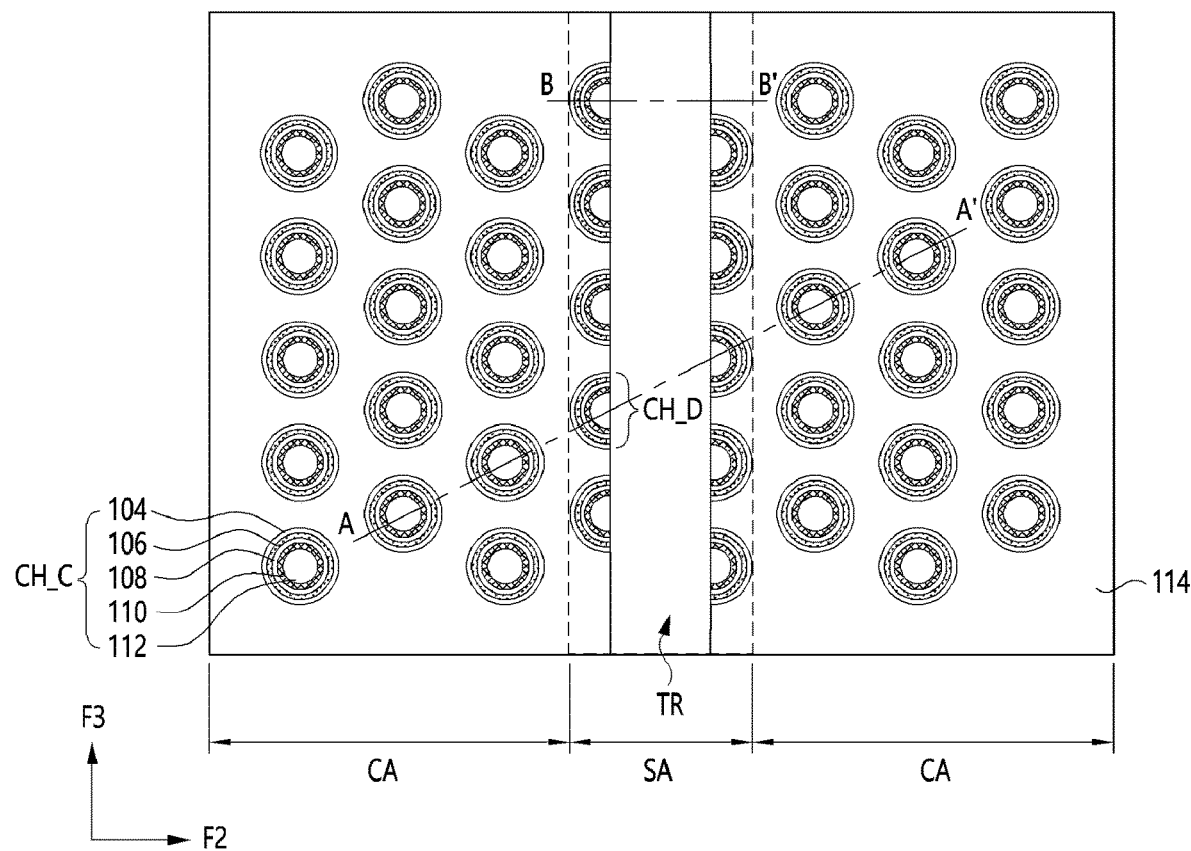
Figure 12B:
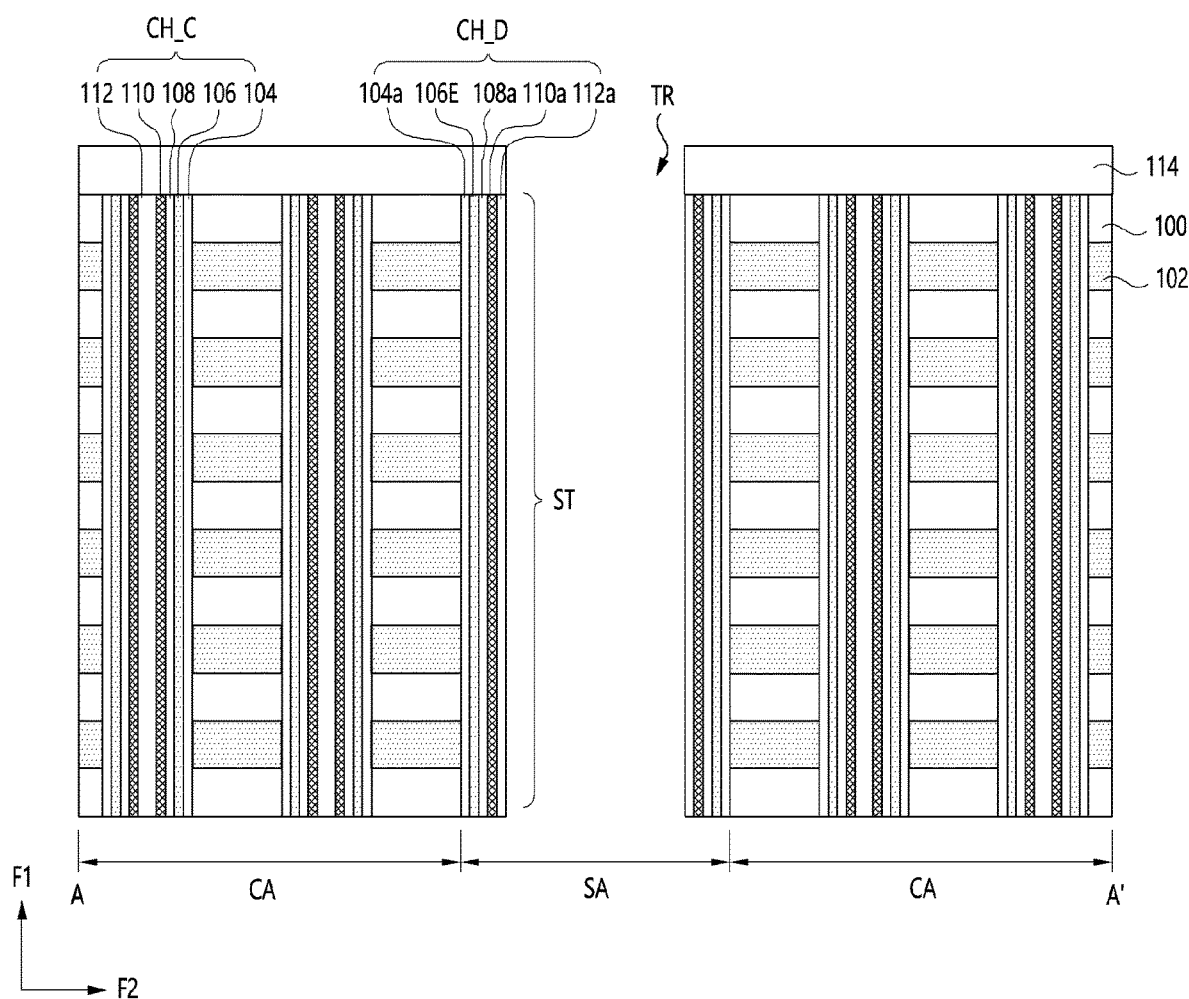
Figure 12C:
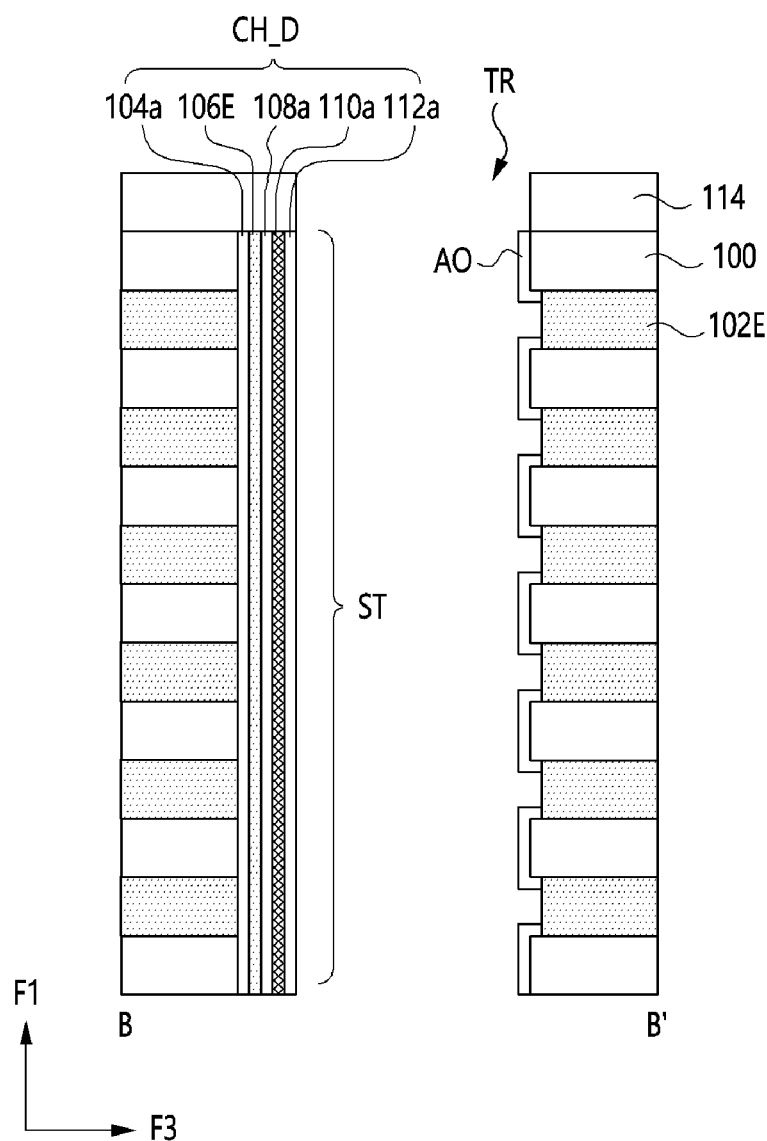
Figure 12D:
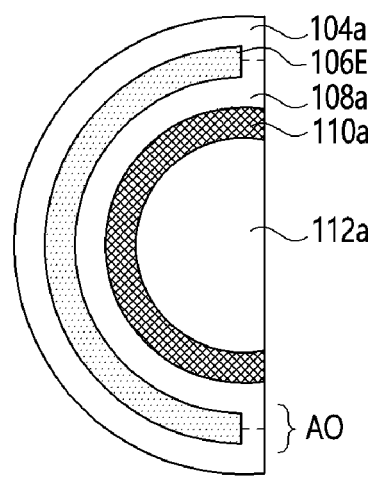
Figure 12E:
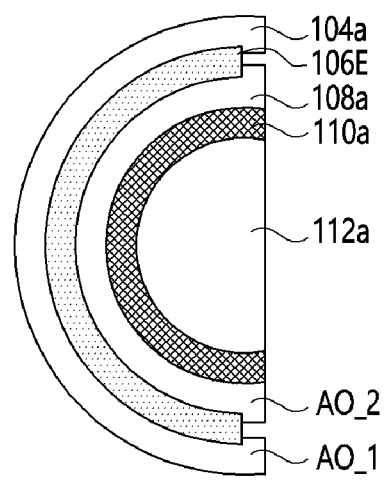
Figure 13A:
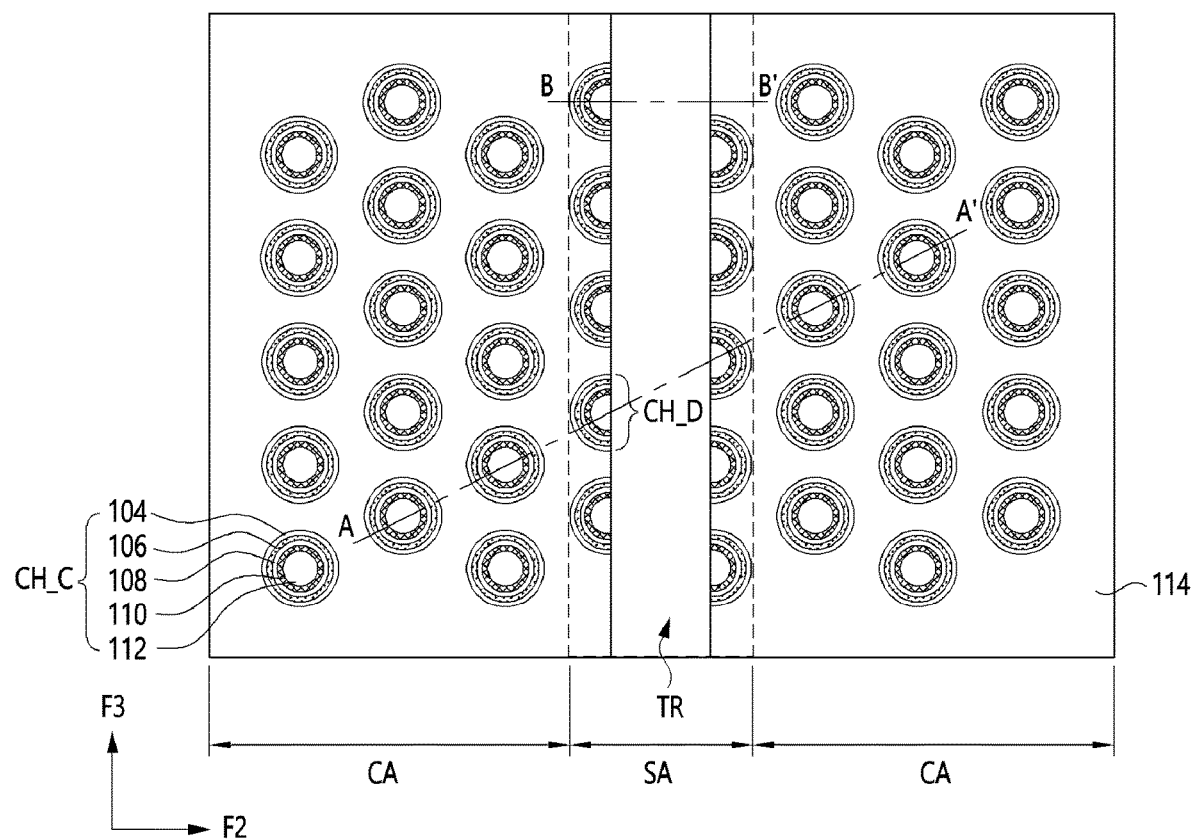
Figure 13B:
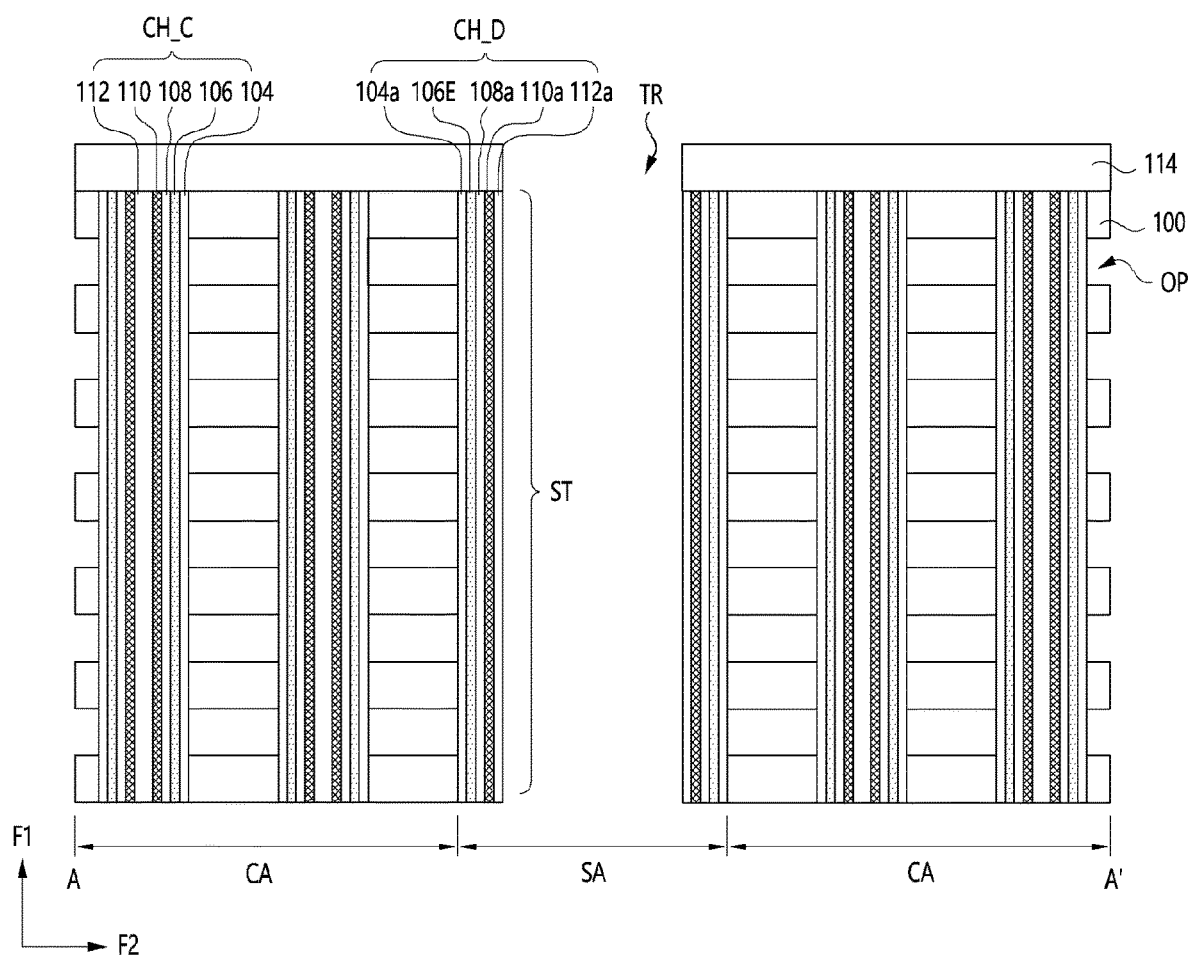
Figure 13C:
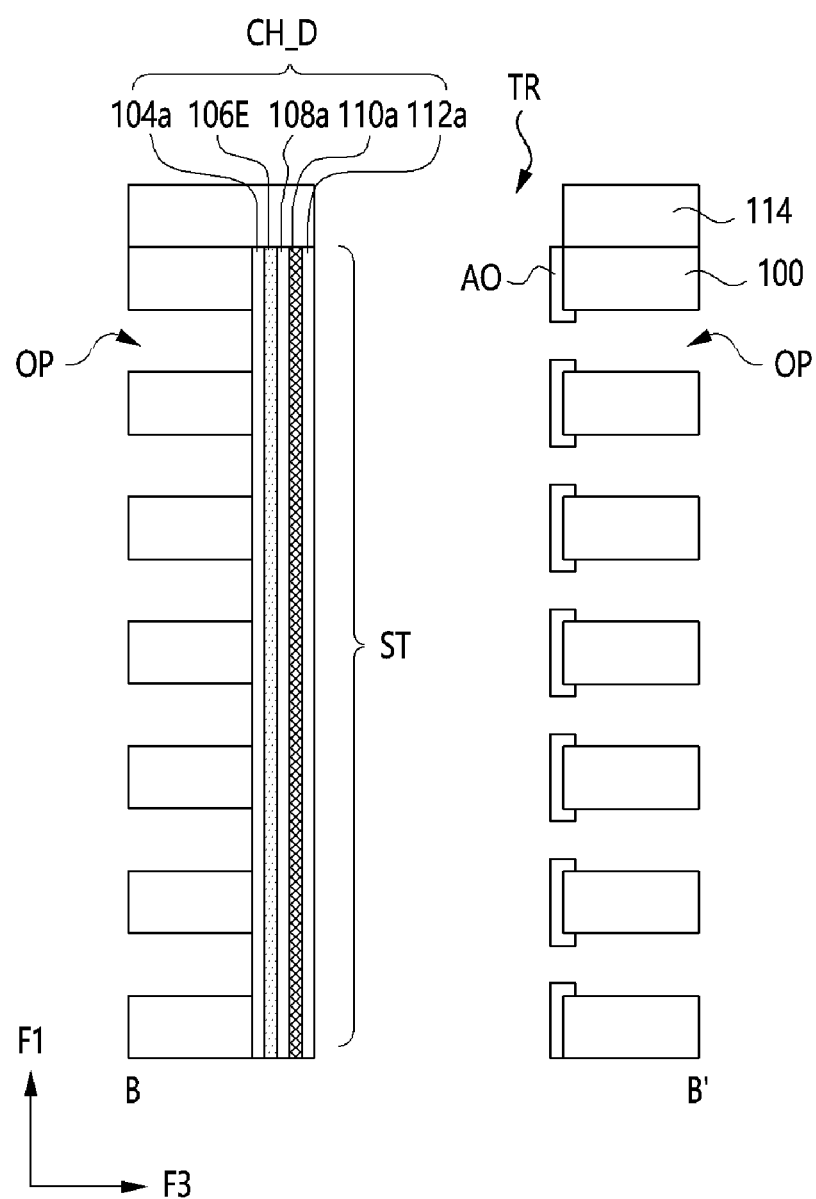

FIGS. 11A, 11B, 11C, 11D, 12A, 12B, 12C, 12D, 13A, 13B, 13C, 13D, 13E, and 13F are views illustrating a method of manufacturing a 3D semiconductor device in accordance with example embodiments. FIGS. 11A, 12A and 13A are plan views of the 3D semiconductor device in accordance with example embodiments. FIGS. 11B, 12B, and 13B are cross-sectional views taken along a line A-A' in FIGS. 11A, 12A, and 13A, respectively. FIGS. 11C, 12C, and 13C are cross-sectional views taken along a line B-B' in FIGS. 11A, 12A, and 13A, respectively. FIGS. 11D, 12D, 12E, 13D, 13E, and 13F are views illustrating dummy channel plugs in FIGS. 11A, 12A, and 13A, respectively.

Cell channel plugs and dummy channel plugs may be formed through a stack structure including insulation layers and sacrificial layers. A trench may then be formed in a slit area. Processes for forming the stack structure, the cell channel plugs, the dummy channel plugs, and the trench may be substantially the same as those illustrated with reference to FIGS. 2A to 5B. Thus, any further illustrations and description with respect to the same processes may be omitted herein for the sake of brevity.

Referring to FIGS. 11A to 11D, the sacrificial layers 102E that are exposed through the trench TR may be partially etched to define a space EP between two adjacent insulation layers 100.

As described above, the second layers 106E may be formed of the same nitride material as the sacrificial layer 102E. Thus, while the sacrificial layers 102E is being etched, a portion of the second layers 106E of the dummy channel plugs CH_D may also be etched to define the space EP between the first layer 104 and the third layer 108.

Referring to FIGS. 12A to 12E, a selective oxidation process may be performed to form the protruded oxide layer AO.

In the stack structure, the protruded oxide layer AO may be selectively formed along the insulation layers 100 that are exposed through the space EP, defined by etching the sacrificial layer 102E. The protruded oxide layer AO may be formed on a side surface, an upper surface, and a lower surface of the insulation layer 100 that protrudes between two adjacent sacrificial layers.

In each of the dummy channel plugs CH_D, the protruded oxide layer AO may be formed in the space EP that is defined by etching the second layer 106E. Referring to FIG. 12D, an etched portion of the second layer 106E may be fully filled with the protruded oxide layer AO. Referring to FIG. 12E, although the protruded oxide layer AO may be formed at the etched portion of the second layer 106E, the etched portion of the second layer 106E might not be fully filled with the protruded oxide layer AO.

Referring to FIGS. 13A to 13F, the sacrificial layers 102E may be removed through the trench TR. By removing the sacrificial layers 102E, an opening OP may be defined between two adjacent insulation layers 100.

Figure 13D:
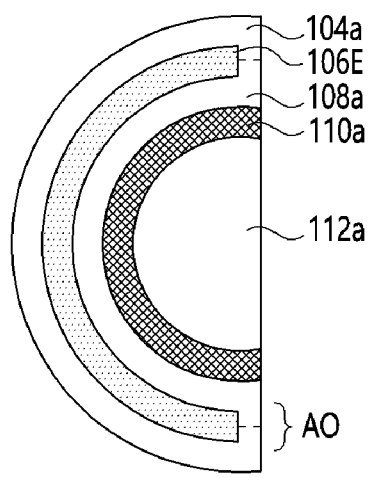
Figure 13E:
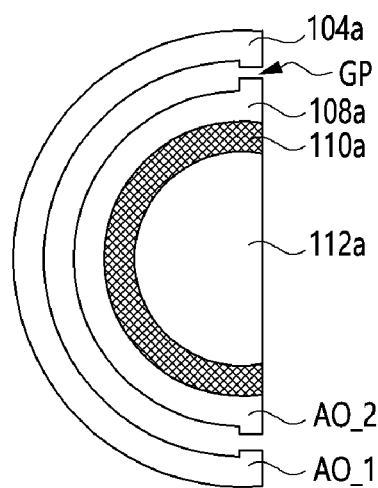
Figure 13F:
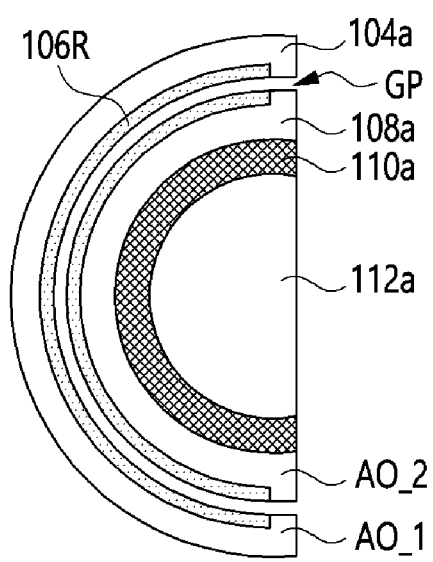

Referring to FIG. 13D, in each of the dummy channel plug channel CH_D, the etched portion of the second layer 106E may be fully filled with the protruded oxide layer AO so that the partially etched second layer 106E might not be etched. Referring to FIG. 13E, the second layer 106E between the first protruded oxide layer AO_1 and the second protruded oxide layer AO_2 and between the first layer 104 and the third layer 108 in FIG. 12E may be fully removed. Referring to FIG. 13F, the second layer 106E might not be fully removed in FIG. 12E. In this case, the second layer 106E may remain between the first layer 104 and the third layer 108.

Processes substantially the same as those illustrated with reference to FIGS. 6A to 9B may be performed to complete the 3D semiconductor device in FIGS. 10A to 10F.

Figure 14:
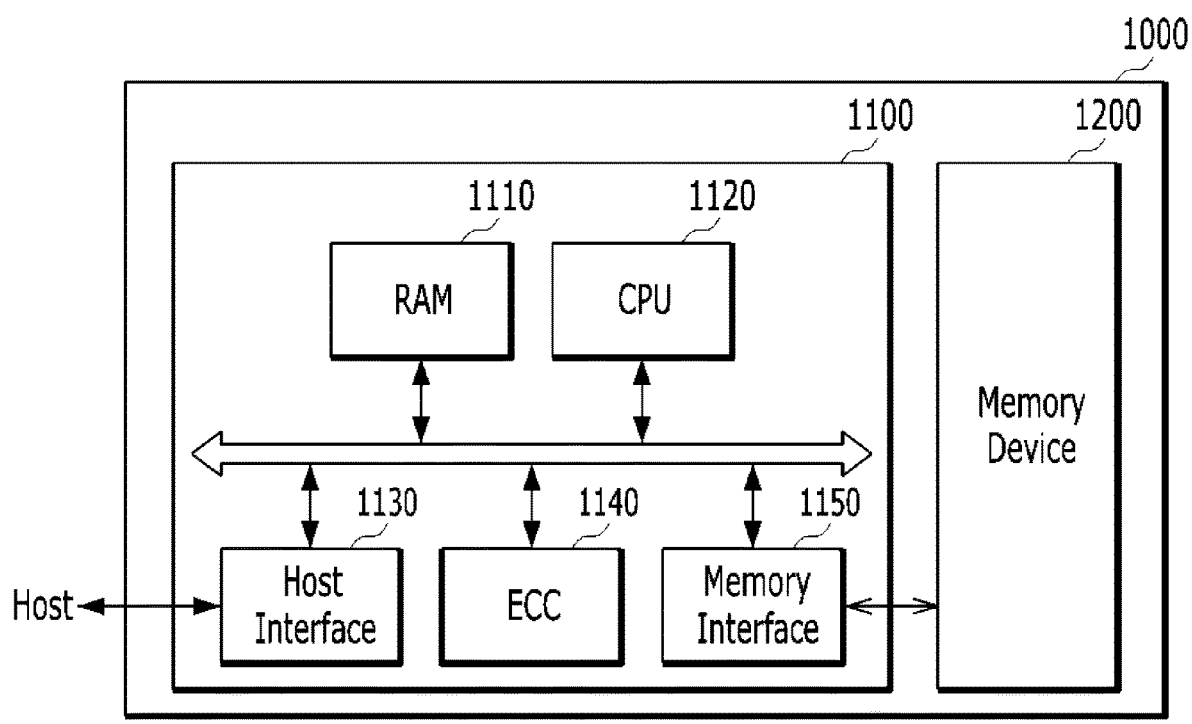
FIG. 14 is a block diagram illustrating a memory system in accordance with example embodiments.

FIG. 14 is a block diagram illustrating a memory system in accordance with example embodiments.

Referring to FIG. 14, a memory system 1000 of example embodiments may include a device 1200 and a controller 1100.

The device 1200 may store data information having various data shapes, such as texts, graphics, software codes, etc. The device 1200 may include a non-volatile memory. As shown in FIGS. 1A to 13F, the device 1200 may include the slit structure between the dummy channel plugs. Thus, the slit structure may have a small size to suppress the warpage that is caused by the dummy channel plugs including aluminum oxide or nitride.

The controller 1100 may be connected with a host and the device 1200. The controller 1100 may access the device 1200 in response to a request of the host. For example, the controller 1100 may control a read operation, a write operation, an erase operation, a background operation, etc., of the device 1200.

The controller 1100 may include a random access memory (RAM) 1110, a central processing unit (CPU) 1120, a host interface 1130, an error correction code (ECC) circuit 1160, a memory interface 1150, etc.

The RAM 1110 may include an operation memory of the CPU 1120, a cache memory between the device 1200 and the host, a buffer memory between the device 1200 and the host, etc. The RAM 1110 may be replaced by a static random access memory (SRAM), a read only memory (ROM), etc.

The CPU 1120 may control the controller 1100. For example, the CPU 1120 may operate a firmware such as a flash translation layer (FTL) stored in the RAM 1110.

The host interface 1130 may be configured to interface with the host. For example, the controller 1100 may be communicated with the host through at least one of a universal serial bus (USB) protocol, a multi-media card (MMC) protocol, a peripheral component interconnection (PCI) protocol, a PCI-express protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The ECC circuit 1160 may detect an error in read data from the device 1200 by using an ECC to correct the error.

The memory interface 1150 may interface with the device 1200. For example, the memory interface 1150 may include a NAND interface, a NOR interface, etc.

For reference, the controller 1100 may further include a buffer memory for temporarily store data. The buffer memory may temporarily store the data transmitted to an external device through the host interface 1130. The buffer memory may temporarily store data transmitted from the device 1200 through the memory interface 1150. The controller 1100 may further include a ROM for storing code data that is used for interfacing with the host.

According to example embodiments, the slit structure of the device 1200 constituting the memory system 1000 may be formed between the dummy channel plugs, to reduce the size of the slit structure. Further, the dummy channel plugs including a conductive material such as aluminum oxide may suppress the warpage of the stack structure to improve characteristics of the memory system 1000.

Figure 15:
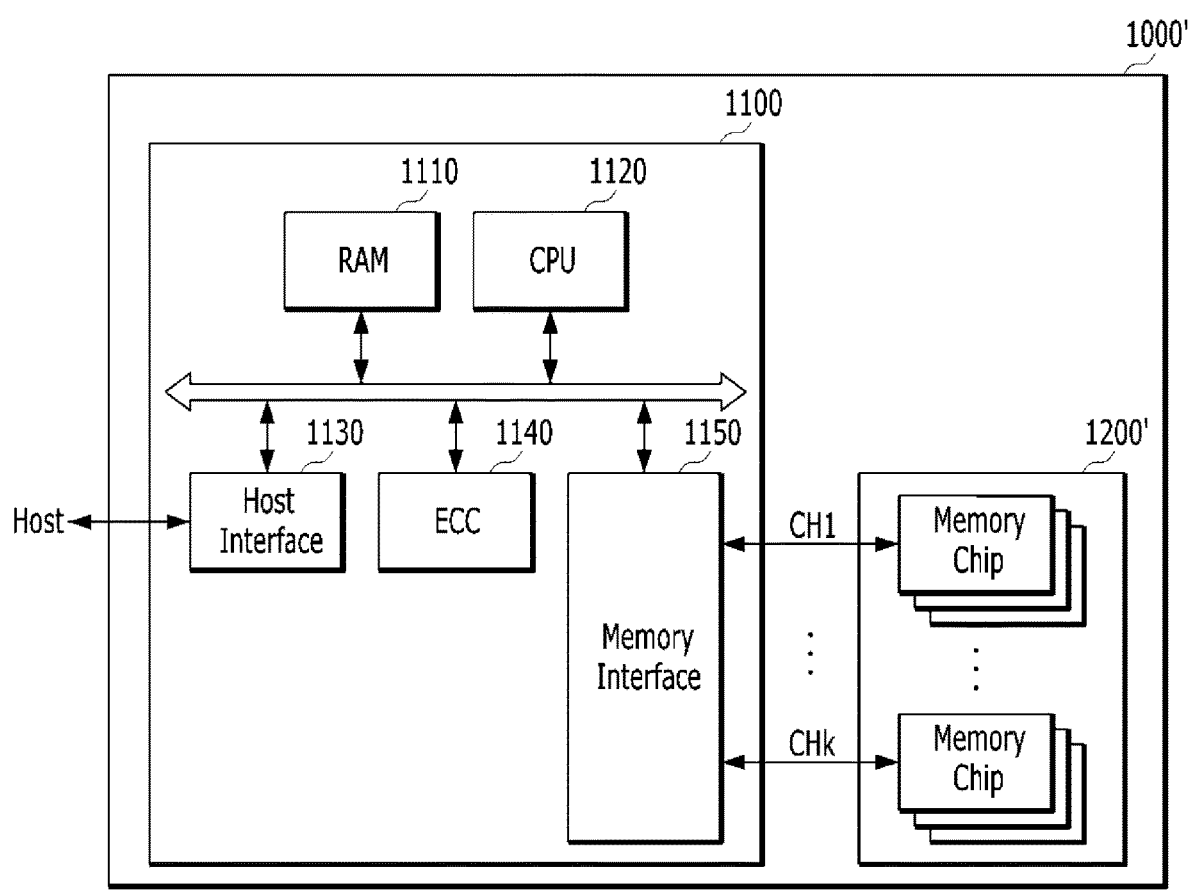
FIG. 15 is a block diagram illustrating a memory system in accordance with example embodiments.

FIG. 15 is a block diagram illustrating a memory system in accordance with example embodiments.

Referring to FIG. 15, a memory system 1000' of example embodiments may include a device 1200' and a controller 1100. The controller 1100 may include a RAM 1110, a CPU 1120, a host interface 1130, an ECC circuit 1160, a memory interface 1150, etc.

The device 1200' may include a non-volatile memory. As shown in FIGS. 1A to 13F, the device 1200 may include the slit structure between the dummy channel plugs. Since the slit structure is configured to occupy portions of the dummy channel plugs, the slit structure of the example embodiments may be formed to have a width narrower than a setting width of the slit for separating memory blocks. Since the dummy channel plugs may include a metal material unlike the channel plugs, the slit structure may be firmly supported by the dummy channel plugs. Further, the dummy channel plugs may serve as a stake for preventing the warpage of the stack structure, thereby preventing the warpage as well as deformations of the channel plugs.

Further, the device 1200' may include a multi-chip package including a plurality of memory chips. The memory chips may be classified into a plurality of groups. The groups may be communicated with the controller 1100 through first to (k)th channels CH1~CHk. The memory chips in one group may be communicated with the controller 1100 through a common channel. The memory system 1000' may include one memory chip connected with one channel.

According to example embodiments, the slit structure of the device 1200 constituting the memory system 1000 may be formed between the dummy channel plugs, to reduce the size of the slit structure. Further, the dummy channel plugs including a conductive material such as aluminum oxide may suppress the warpage of the stack structure to improve characteristics of the memory system 1000.

Figure 16:
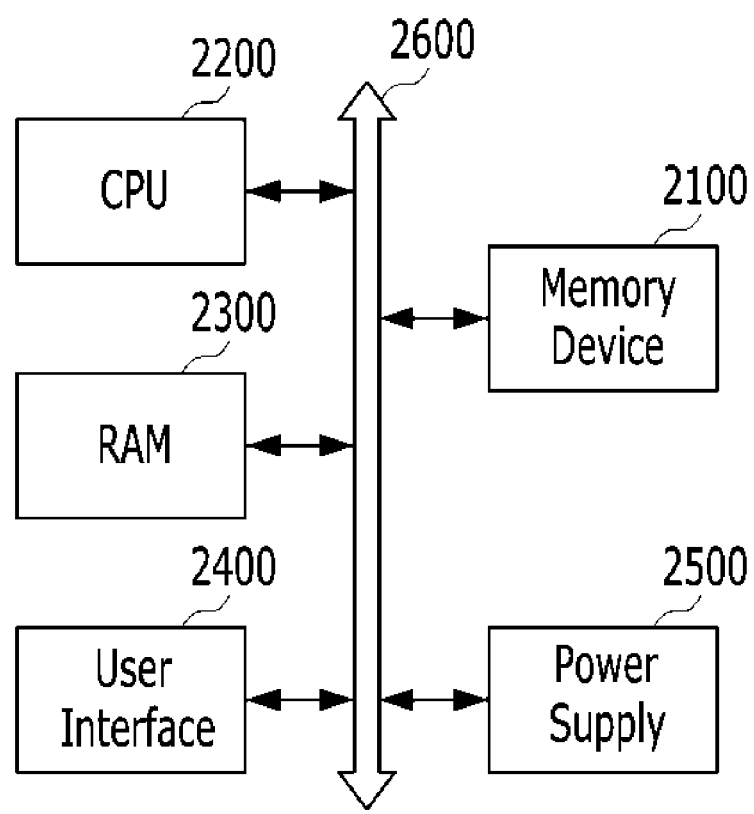
FIG. 16 is a block diagram illustrating a computing system in accordance with example embodiments.

FIG. 16 is a block diagram illustrating a computing system in accordance with example embodiments.

Referring to FIG. 16, a computing system 2000 of example embodiments may include a device 2100, a CPU 2200, a RAM 2300, a user interface 2400, a power supply 2500, a system bus 2600, etc.

The device 2100 may store data that is provided through the user interface 2400, data that is processed by the CPU 2200, etc. The device 2100 may be electrically connected with the CPU 2200, the RAM 2300, the user interface 2400 and the power supply 2500 through the system bus 2600. For example, the device 2100 may be indirectly connected with the system bus 2600 through a controller, or directly connected with the system bus 2600. When the device 2100 may be directly connected with the system bus 2600, the functions of the controller may be performed by the CPU 2200 and the RAM 2300.

The device 2100 may include a non-volatile memory. As shown in FIGS. 1A to 13F, the device 2100 may include the slit structure of the device 1200 constituting the memory system 1000 formed between the dummy channel plugs, to reduce the size of the slit structure. Further, the dummy channel plugs including a conductive material, such as aluminum oxide, may suppress the warpage of the stack structure to improve characteristics of the memory system 1000.

Further, the device 1200' may include a multi-chip package including a plurality of memory chips. The memory chips may be classified into a plurality of groups. The groups may be communicated with the controller 1100 through first to (k)th channels CH1~CHk. The memory chips in one group may be communicated with the controller 1100 through a common channel. The memory system 1000' may include one memory chip connected with one channel.

According to example embodiments, the slit structure of the memory system 1000' may be formed at the dummy channel plugs to reduce the size of the slit structure. Further, the dummy channel plugs including aluminum oxide may suppress the warpage to improve characteristics of the memory system 1000.

In example embodiments, the computing system 2000 may include a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game player, a navigator, a black box, a digital camera, a 3-dimensional television, a digital audio recorder, a digital audio player, a digital picture recorder, a digital picture player, a digital video recorder, a digital video player, etc.

According to example embodiments, the slit structure of the computing system 2000 may be formed at the dummy channel plugs to reduce the size of the slit structure. Further, the dummy channel plugs including aluminum oxide may suppress the warpage to improve characteristics of the memory system 1000.

Figure 17:
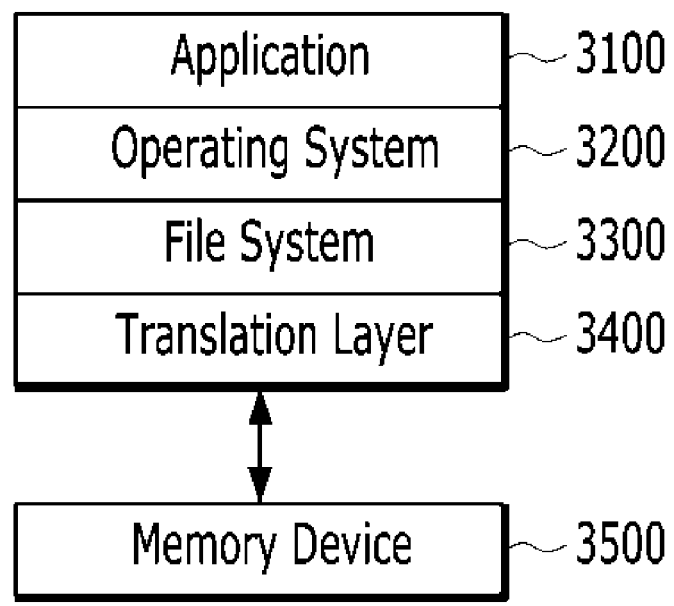
FIG. 17 is a block diagram illustrating a computing system in accordance with example embodiments.

FIG. 17 is a block diagram illustrating a computing system in accordance with example embodiments.

Referring to FIG. 17, a computing system 3000 may include a software layer such as an application 3100, an operating system 3200, a file system 3300, a translation layer 3400, etc. The computing system 3000 may include a hardware layer such as a memory device 3500.

The operating system 3200 may manage the software and the hardware of the computing system 300. The operating system 3200 may control operations of programs in the CPU. The application 3100 may include various application programs performed in the computing system 3000. The application 3100 may include utilities performed by the operating system 3200.

The file system 3300 may be a logical structure for managing data, file, etc., in the computing system 3000. The file system 3300 may organize the file or the data stored in the memory device 3500 by rules. The file system 3300 may be determined by the operating system 3200 used in the computing system 3000. For example, when the operating system 3200 may be Windows of Microsoft, the file system 3300 may be a file allocation table (FAT), a NT file system (NTFS), etc. When the operating system 3200 may be Unix/Linux, the file system 3300 may be an extended file system (EXT), a Unix file system (UFS), a journaling file system (JFS), etc.

In example embodiments, the operating system 3200, the application 3100 and the file system 330 may be depicted by separated blocks. Alternatively, the application 3100 and the file system 3300 may be included in the operating system 3200.

The translation layer 3400 may convert an address into a shape suitable for the memory device 3500 in response to a request of the file system 3300. For example, the translation layer 3400 may convert a logic address that is generated by the file system 3300 into a physical address of the memory device 3500. Mapping information of the logic address and the physical address may be stored as an address translation table. For example, the translation layer 3400 may be a flash translation layer (FTL), a universal flash storage link layer (ULL), etc.

The memory device 3500 may include a non-volatile memory in FIGS. 1A to 13F. The computing system 3000 may be classified into an operating system class that is performed by a high-ranked level and an operating system class that is performed by a low-ranked level. The application 3100, the operating system 3200 and the file system 3300 may be included in the operating system class. The application 3100, the operating system 3200 and the file system 3300 may be driven by an operation memory of the computing system 3000. The translation layer 3400 may be included in the operating system class or a controller class.

According to example embodiments, the slit structure of the computing system 3000 may be formed at the dummy channel plugs to reduce the size of the slit structure. Further, the dummy channel plugs including aluminum oxide may suppress the warpage to improve characteristics of the memory system 1000.

The above described embodiments of the present disclosure are intended for illustration purposes and are not to limit the present disclosure. Various alternatives and equivalents are possible. The present disclosure is not limited by the embodiments described herein. Furthermore, the present disclosure is not limited to any specific type of semiconductor device. Other additions, subtractions, or modifications are obvious in view of the present disclosure and are intended to fall within the scope of the appended claims.

What is claimed is:

1. A three-dimensional (3D) semiconductor device comprising:
    at least one stack structure, each of the stack structure including at least one conductive layer and at least one insulation layer which alternately stacked in a vertical direction;
    a plurality of channel plugs vertically formed through the stack structure;
    a slit structure arranged in a sidewall of the stack structure; and
    a plurality of dummy channel plugs arranged in the stack structures to be adjacent to the slit structure,
    wherein each of the channel plugs includes a channel insulation layer and a channel layer, and
    wherein each of the dummy channel plugs includes the channel insulation layer, the channel layer, and a material of the conductive layer.

2. The 3D semiconductor device of claim 1, wherein the plurality of channel plugs is arranged along n columns and m rows, respectively,
    wherein the plurality of dummy channel plugs having an arrangement substantially the same as an arrangement of the channel plug in a (n−1)th column, and
    wherein n and m are natural numbers greater than 1.

3. The 3D semiconductor device of claim 1, wherein, in a plan view orthogonal to the vertical direction, each of the dummy channel plugs has a semi-circular shape, and each of the channel plugs has a circular shape, and
    wherein, a diameter of each of the dummy channel plugs is equal to a diameter of the channel plug.

4. The 3D semiconductor device of claim 1, wherein a structure of the channel insulation layer of the dummy channel plug is different from a structure of the channel insulation layer of the channel plug.

5. The 3D semiconductor device of claim 1, wherein the channel plug comprises a plurality of channel plugs in n columns and m rows,
    wherein a distance between a channel plug in a (i)th row (i is a natural number less than n) and a (j)th column (j is a natural number less than m) and a channel plug in a (n+1) row and a (j+1) column is substantially the same as a distance between a channel plug in a (i+1)th row and a (j+1)th column and a channel plug in a (n+2) row and a (j+2) column, and
    wherein an arrangement of channel plugs in the (j)th column is substantially the same as an arrangement of channel plugs in the (j+2) column, and an arrangement of channel plugs in the (i)th row is substantially the same as an arrangement of channel plugs in the (i+2) row.

6. The 3D semiconductor device of claim 1, wherein the plurality of dummy channel plugs is arranged along a first column and a second column, respectively,
    wherein the dummy channel plugs in the first column have an arrangement substantially the same as an arrangement of the channel plugs in a (n−1)th column,
    wherein the dummy channel plugs in the second column have an arrangement substantially the same as an arrangement of the channel plugs in a (n)th column, and
    wherein n is a natural number greater than 1.

7. The 3D semiconductor device of claim 1, wherein the plurality of dummy channel plugs is arranged along a first column and a second column, respectively, and
    wherein the slit structure is arranged between the dummy channel plugs in the first column and the dummy channel plugs in the second column.

8. The 3D semiconductor device of claim 1, wherein the stack structure includes a protruded oxide layer formed between the slit structure and at least one portion of the conductive layer, and
    wherein the protruded oxide layer is formed within a border formed by the conductive layer and the insulation layer, which are adjacent to each other.

* * * * *